US012804885B2

(12) United States Patent
Kim et al.

(10) Patent No.: US 12,804,885 B2
(45) Date of Patent: Nov. 17, 2026

(54) SEMICONDUCTOR DEVICE

(71) Applicant: Samsung Electronics Co., Ltd., Suwon-si (KR)

(72) Inventors: Kyumin Kim, Suwon-si (KR); Taeyong Song, Suwon-si (KR); Jaeyoung An, Suwon-si (KR); Jieun Lee, Suwon-si (KR); Deoksung Hwang, Suwon-si (KR); Yejin Kwon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 574 days.

(21) Appl. No.: 18/309,144

(22) Filed: Apr. 28, 2023

(65) Prior Publication Data

US 2024/0057320 A1 Feb. 15, 2024

(30) Foreign Application Priority Data

Aug. 11, 2022 (KR) ........................ 10-2022-0100503

(51) Int. Cl.
*H10B 12/00* (2023.01)

(52) U.S. Cl.
CPC ....... *H10B 12/482* (2023.02); *H10B 12/0335* (2023.02); *H10B 12/315* (2023.02)

(58) Field of Classification Search
CPC . H10B 12/0335; H10B 12/315; H10B 12/482
See application file for complete search history.

(56) References Cited

U.S. PATENT DOCUMENTS 10,037,999 B2 7/2018 Kim et al.
10,461,153 B2 10/2019 Lee et al.
(Continued)

FOREIGN PATENT DOCUMENTS

CN 114256244 A 3/2022
CN 114388446 A 4/2022
(Continued)

OTHER PUBLICATIONS

Extended European Search Report dated Feb. 27, 2024 issued in European Patent Application No. 23181551.5-1212.
(Continued)

*Primary Examiner* — Meiya Li
(74) *Attorney, Agent, or Firm* — HARNESS, DICKEY & PIERCE, P.L.C.

(57) ABSTRACT

A semiconductor device may include bit line structures extending in one direction on a substrate, insulation structures between the bit line structures and spaced apart from each other, and a landing pad structure in each of openings between the bit line structures and the insulation structures. The landing pad structure may include a first barrier metal pattern filling a portion of the opening, a second barrier metal pattern along a surface profile of the opening on the first barrier metal pattern, and a first metal pattern on the second barrier metal pattern. The second barrier metal pattern may have end portions on the bit line structures adjacent the opening. The first metal pattern may have an upper surface higher than an upper surface of the bit line structure. An uppermost surface of the first barrier metal pattern is lower than a lowermost surface of the first metal pattern.

19 Claims, 29 Drawing Sheets

(56) References Cited

U.S. PATENT DOCUMENTS

| | | | |
|---|---|---|---|
| 10,665,592 B2 | 5/2020 | Song et al. | |
| 10,854,676 B2 | 12/2020 | Feng et al. | |
| 11,189,570 B2 | 11/2021 | Kim et al. | |
| 2018/0040560 A1* | 2/2018 | Kim .................... | H10W 10/021 |
| 2019/0088739 A1 | 3/2019 | Lee et al. | |
| 2019/0164975 A1 | 5/2019 | Song et al. | |
| 2020/0091305 A1 | 3/2020 | Yoon et al. | |
| 2020/0194374 A1 | 6/2020 | Kim et al. | |
| 2021/0134804 A1* | 5/2021 | Jung .................... | H10B 12/315 |
| 2021/0335792 A1 | 10/2021 | Su | |
| 2021/0375878 A1 | 12/2021 | Zhang et al. | |
| 2022/0037327 A1 | 2/2022 | Tung et al. | |
| 2022/0045182 A1 | 2/2022 | Kim et al. | |
| 2022/0093387 A1 | 3/2022 | Lee et al. | |
| 2022/0102528 A1 | 3/2022 | Kim et al. | |
| 2022/0115383 A1 | 4/2022 | Yoon et al. | |
| 2022/0157822 A1 | 5/2022 | Ahn et al. | |
| 2022/0181457 A1 | 6/2022 | Yoon et al. | |
| 2022/0199534 A1 | 6/2022 | Siew et al. | |
| 2022/0238534 A1 | 7/2022 | Seong et al. | |
| 2022/0246620 A1 | 8/2022 | Kang et al. | |
| 2023/0290727 A1 | 9/2023 | Park et al. | |

FOREIGN PATENT DOCUMENTS

| | | |
|---|---|---|
| KR | 10-2198857 B1 | 1/2014 |
| KR | 10-2015-0088635 A | 8/2015 |
| KR | 10-2019-0032718 A | 3/2019 |
| KR | 10-2019-0063092 A | 6/2019 |
| KR | 10-2021-0078324 A | 6/2021 |
| TW | 201826525 A | 7/2018 |
| TW | 202011517 A | 3/2020 |
| TW | 202220171 A | 5/2022 |
| TW | 202221893 A | 6/2022 |
| TW | 202221894 A | 6/2022 |
| TW | 202224188 A | 6/2022 |

OTHER PUBLICATIONS

Korean Office Action dated Feb. 12, 2026 for corresponding Korean Patent Application No. 10-2022-0100503 and its English-language translation.

* cited by examiner

SEMICONDUCTOR DEVICE

CROSS-REFERENCE TO RELATED APPLICATION

This application claims priority under 35 USC § 119 to Korean Patent Application No. 10-2022-0100503, filed on Aug. 11, 2022, in the Korean Intellectual Property Office (KIPO), the contents of which are incorporated by reference herein in their entirety.

BACKGROUND

Various example embodiments relate to a semiconductor device. Particularly, various example embodiments relate to a DRAM (Dynamic random-access memory) device.

In a DRAM device, a landing pad structure electrically connected with a capacitor and an active pattern may be formed or arranged between bit line structures. As an aspect ratio of the landing pad structure increases, a structure of the landing pad structure becomes unstable. Thus, a defect in which an upper portion of the landing pad structure is broken may occur.

SUMMARY

Various example embodiments provide a semiconductor device including a landing pad structure.

According to some example embodiments, there is provided a semiconductor device. The semiconductor device may include bit line structures on a substrate and extending in one direction, insulation structures between the bit line structures and spaced apart from each other, and a landing pad structure arranged in each of openings between the bit line structures and the insulation structures. The landing pad structure may include a first barrier metal pattern filling a portion of the opening, a second barrier metal pattern arranged along a surface profile of the opening on the first barrier metal pattern, and a first metal pattern on the second barrier metal pattern. The second barrier metal pattern may have end portions on the bit line structures adjacent the opening. The first metal pattern may have an upper surface higher than an upper surface of the bit line structure. An uppermost surface of the first barrier metal pattern may be lower than a lowermost surface of the first metal pattern.

According to some example embodiments, there is provided a semiconductor device. The semiconductor device may include a first gate structure below the upper surface of a substrate and extending in a first direction, bit line structures on the substrate and extending in a second direction perpendicular to the first direction, insulation structures between the bit line structures and spaced apart in the second direction, lower contact plug in a lower portion of each of contact holes between the bit line structures and the insulation structures, a landing pad structure on the lower contact plug, and a capacitor on the landing pad structure. The landing pad structure may include a first barrier metal pattern on the lower contact plug and filling a portion of the opening and upper portion of the first barrier metal pattern including a void, a second barrier metal pattern formed along a surface profile of the opening on the first barrier metal pattern and covering the void, and a first metal pattern on the second barrier metal pattern. The second barrier metal pattern may have end portions on the bit line structures adjacent the opening. The first metal pattern may have an upper surface higher than an upper surface of the bit line structure. An uppermost surface of the first barrier metal pattern may be lower than a lowermost surface of the first metal pattern.

According to some example embodiments, there is provided a semiconductor device. The semiconductor device may include a substrate including a cell region and a core/peripheral region, a first gate structure under an upper surface of the cell region of the substrate, bit line structures on the cell region of the substrate, a second gate structure on the core/peripheral region of the substrate, impurity regions at the substrate adjacent to both sides of the second gate structure, a landing pad structure between the bit line structures, a capacitor on the landing pad structure, a first wiring electrically connected to the first gate structure, a second wiring electrically connected to the bit line structure, and a third wiring electrically connected to the impurity regions and contacting the impurity regions. An upper surface of the landing pad structure may be higher than an upper surface of each of the bit line structures. Each of the landing pad structure, the first wiring, the second wiring, and the third wiring may include a first barrier metal pattern having a pillar shape, a second barrier metal pattern on the first barrier metal pattern, and a first metal pattern on the second barrier metal pattern. The first metal pattern may have an upper surface higher than an upper surface of the bit line structure. An uppermost surface of the first barrier metal pattern may be lower than a lowermost surface of the first metal pattern.

In various example embodiments, the landing pad structure included in the semiconductor device may include the first barrier metal pattern having a pillar shape, the second barrier metal pattern and the metal pattern disposed on the first barrier metal pattern. As the first barrier metal pattern is included in the landing pad structure, an aspect ratio of an opening for forming the metal pattern may decrease. Therefore, a void may not be included in the metal pattern or may be less likely to be included in the metal pattern. Alternatively or additionally, even if wet cleaning is performed after forming the landing pad structure, an upper portion of a void included in the landing pad structure may not be opened. Therefore, the landing pad structure may have a stable or more stable structure.

BRIEF DESCRIPTION OF THE DRAWINGS

Various example embodiments will be more clearly understood from the following detailed description taken in conjunction with the accompanying drawings.

FIGS. 1 to 27 are cross-sectional views and plan views illustrating a method of manufacturing a semiconductor device in accordance with some example embodiments; and FIGS. 28 and 29 are a cross-sectional view and an enlarged cross-sectional view illustrating semiconductor devices in accordance with example embodiments.

DETAILED DESCRIPTION

Hereinafter, various example embodiments will be described in detail with reference to the accompanying drawings.

FIGS. 1 to 27 are cross-sectional views and plan views illustrating a method of manufacturing a semiconductor device in accordance with various example embodiments.

Figure 1:
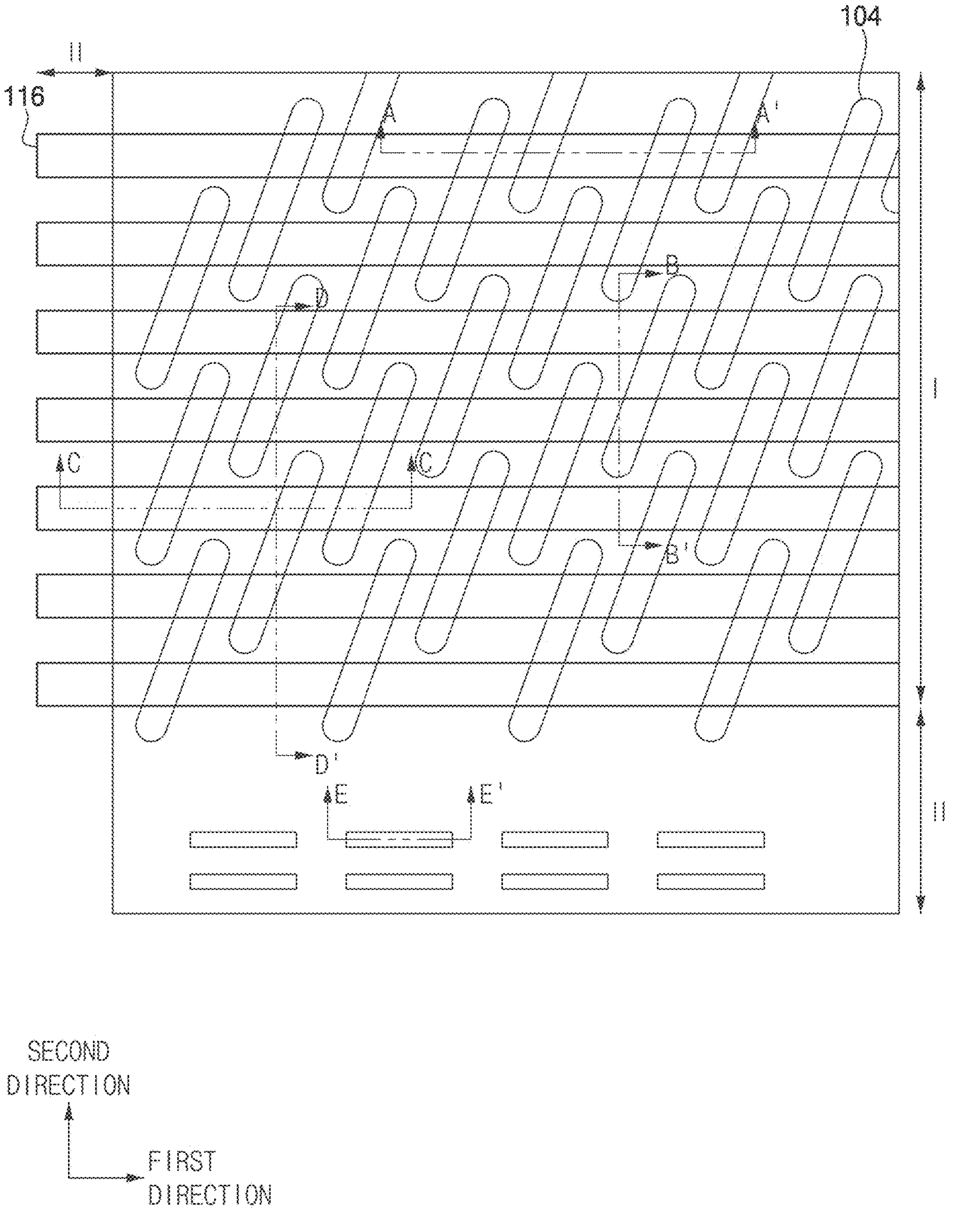
FIGS. 1 to 29 represent various non-limiting, example embodiments as described herein.
Figure 5:
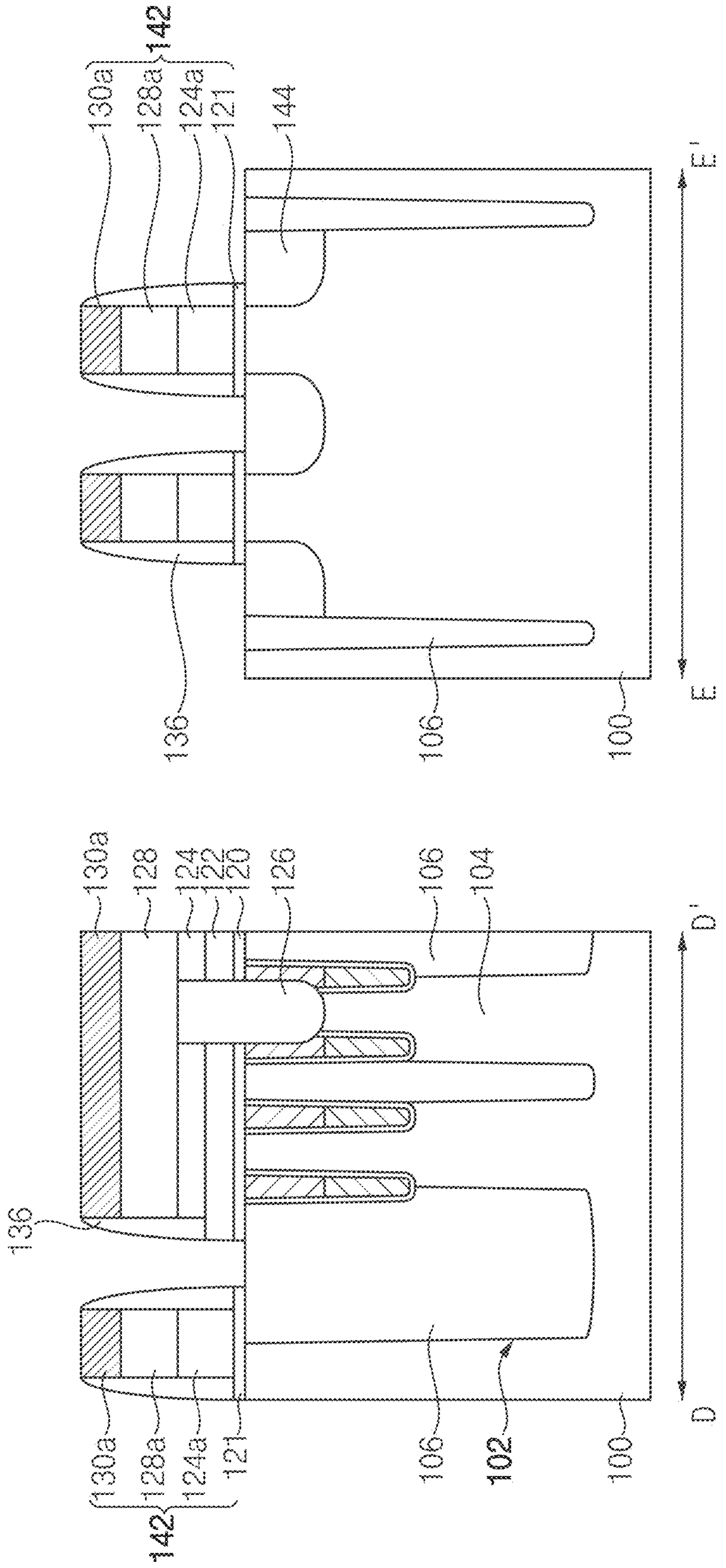
Figure 6:
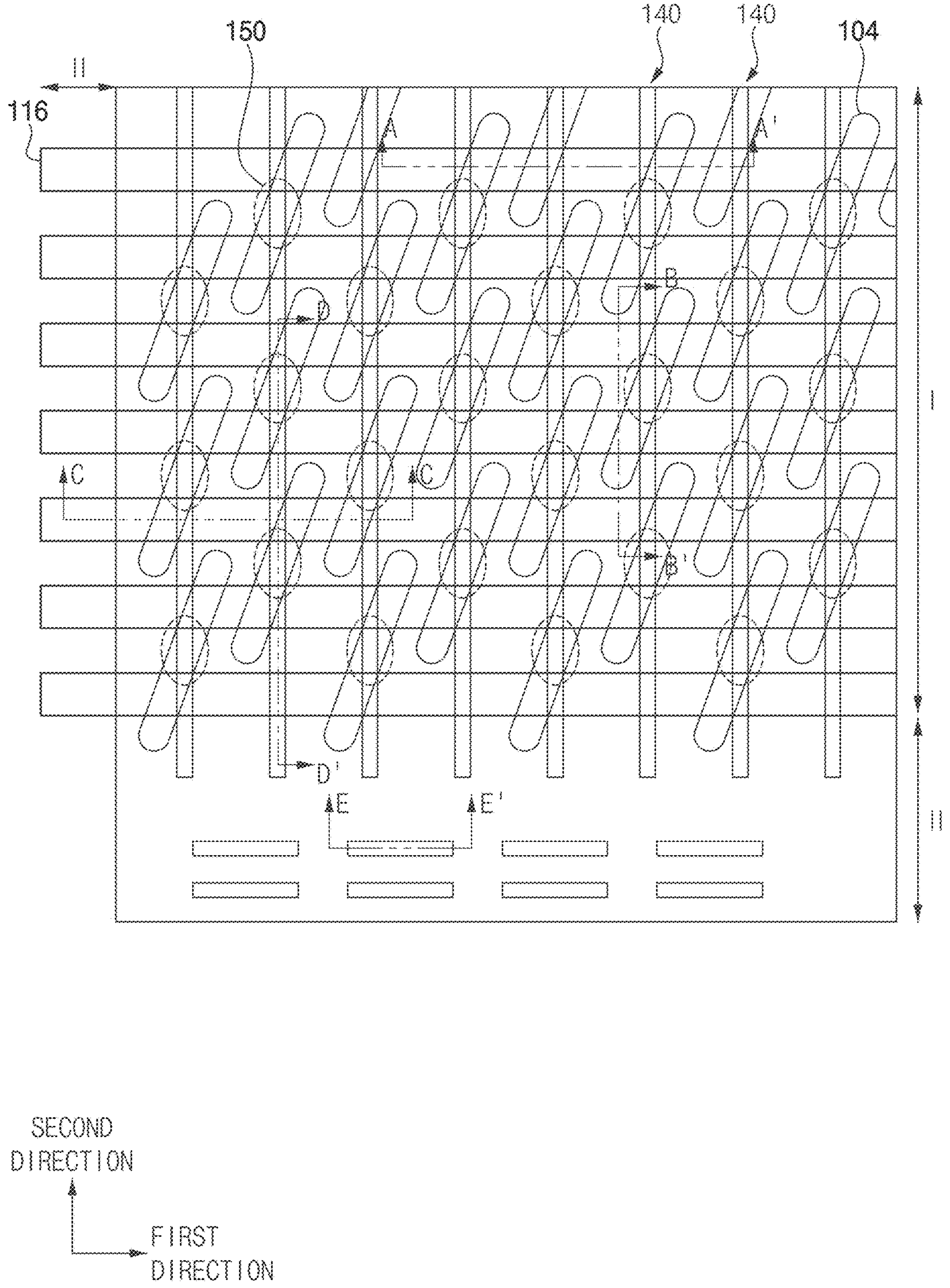
Figure 22:
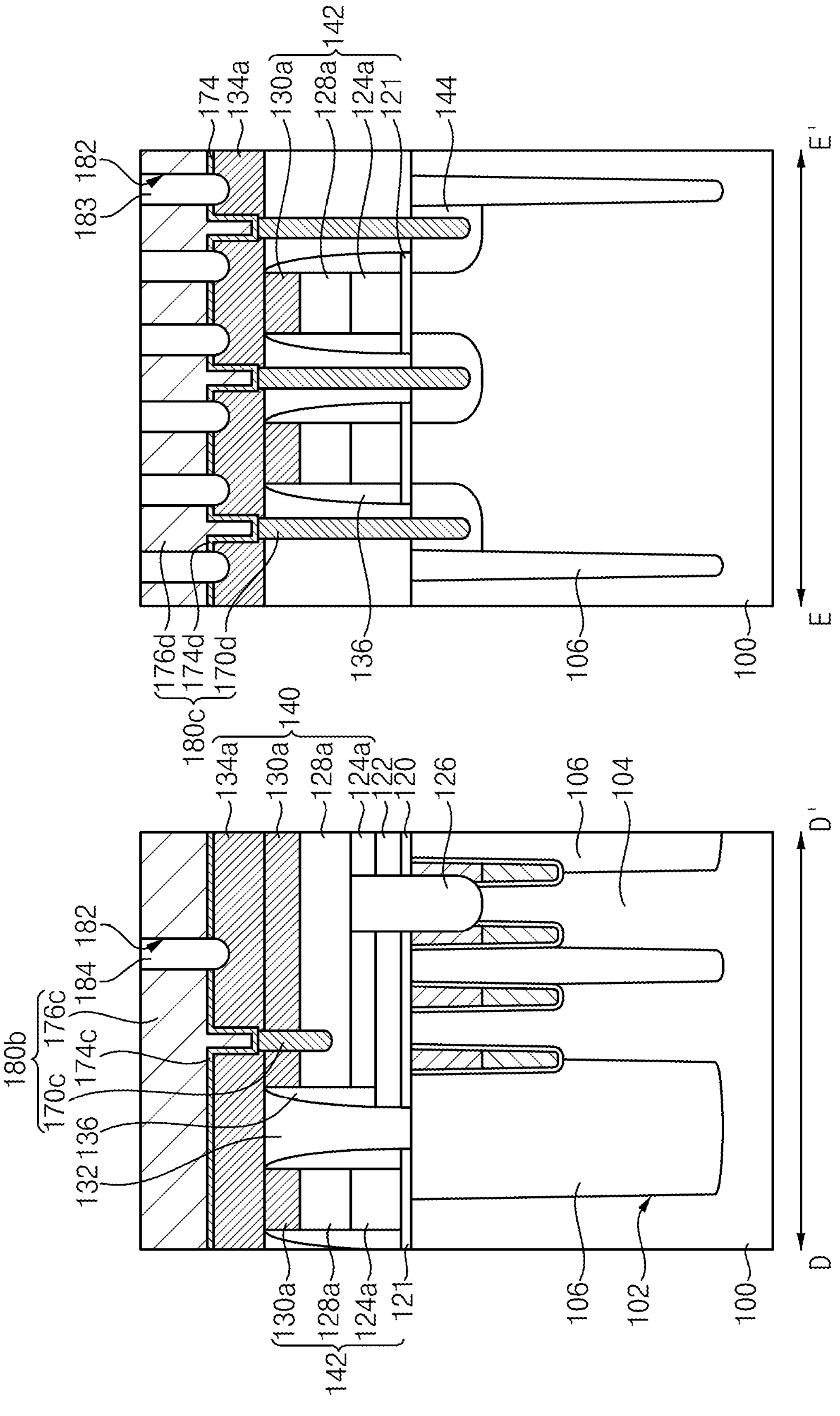
Figure 23:
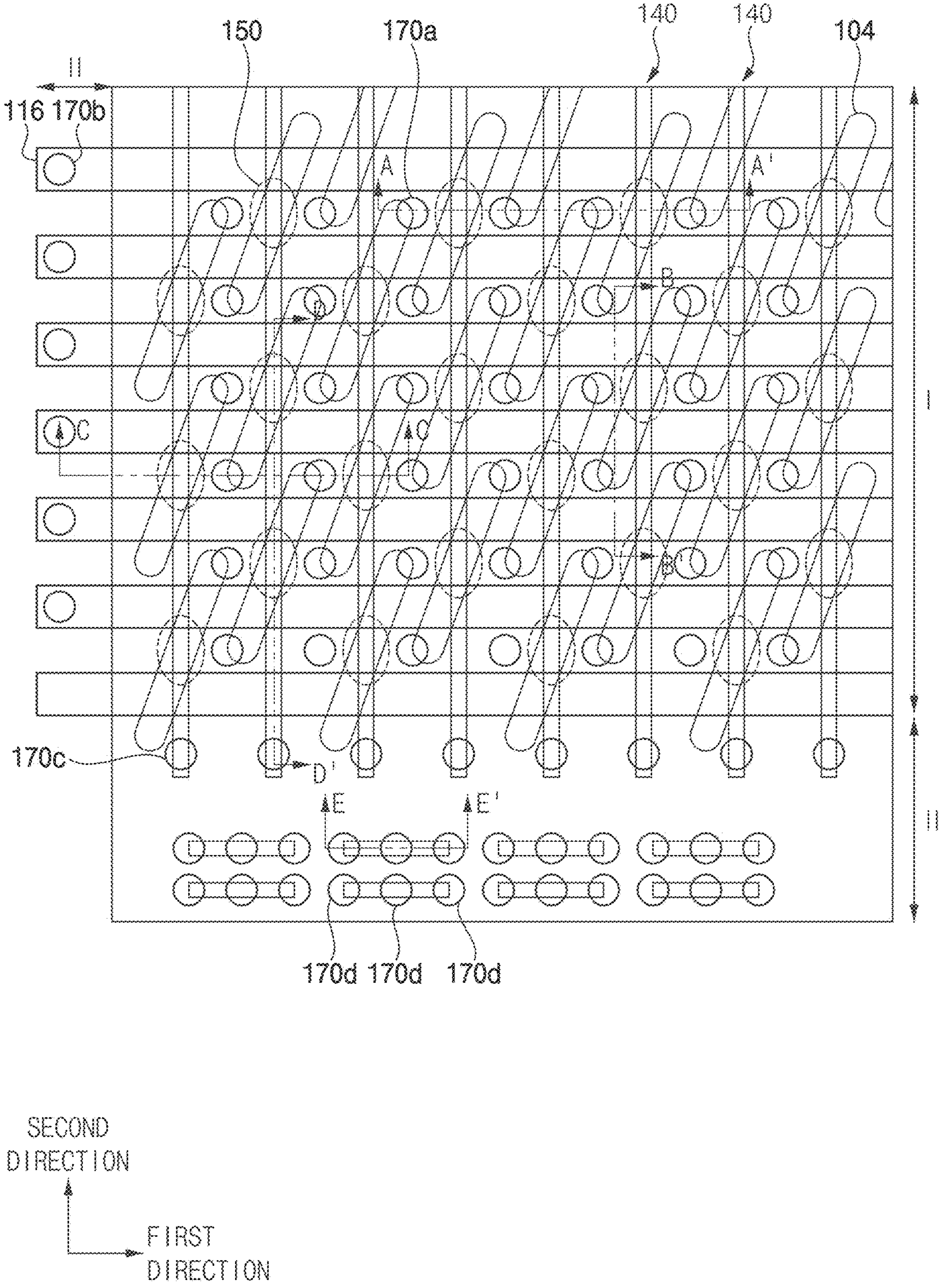

FIGS. 1, 6 and 23 are plan views. FIGS. 2, 4, 7, 9, 10, 13, 15, 16, 18, 19, 21, 24 to 27 include cross-sections of A-A', B-B' and/or C-C' in each of plan views. FIGS. 3, 5, 8, 11, 12, 14, 17, 20 and 22 include cross-sections of A-N, D-D' and E-E' in each of plan views. FIGS. 16, 19, and 26 are enlarged cross-sectional views of a portion of a semiconductor device.

Hereinafter, an extension direction of a first gate structure may be referred to as a first direction, and a direction intersecting or perpendicular to the first direction (e.g., an extension direction of a bit line) may be referred to as a second direction. In addition, a direction having an inclination with respect to the first direction may be referred to as a third direction.

Figure 2:
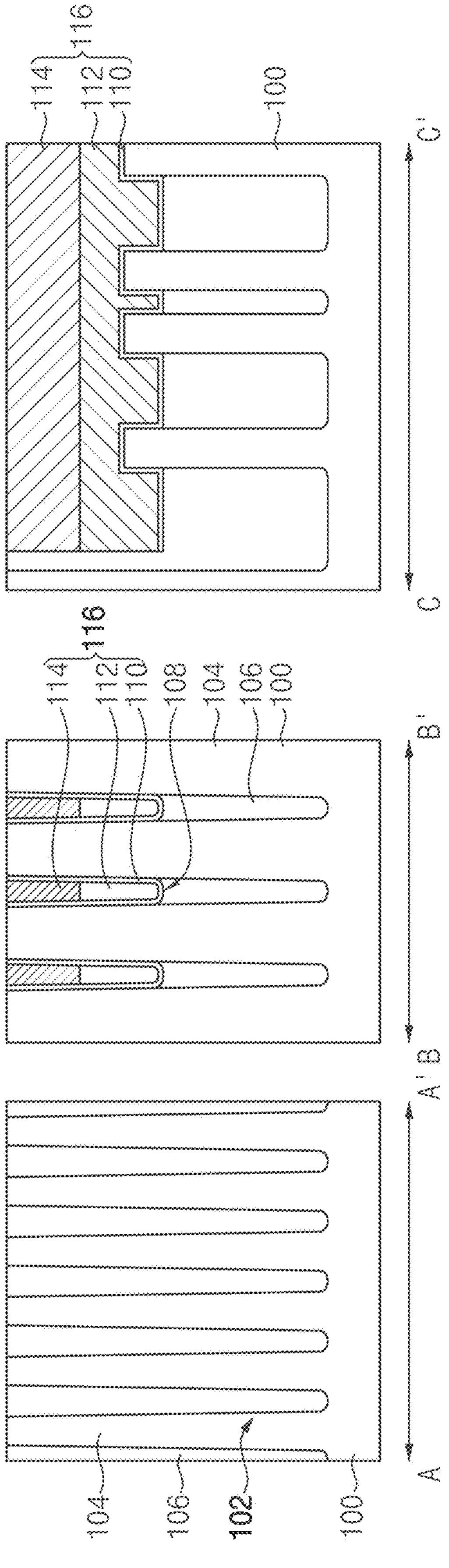
Figure 3:
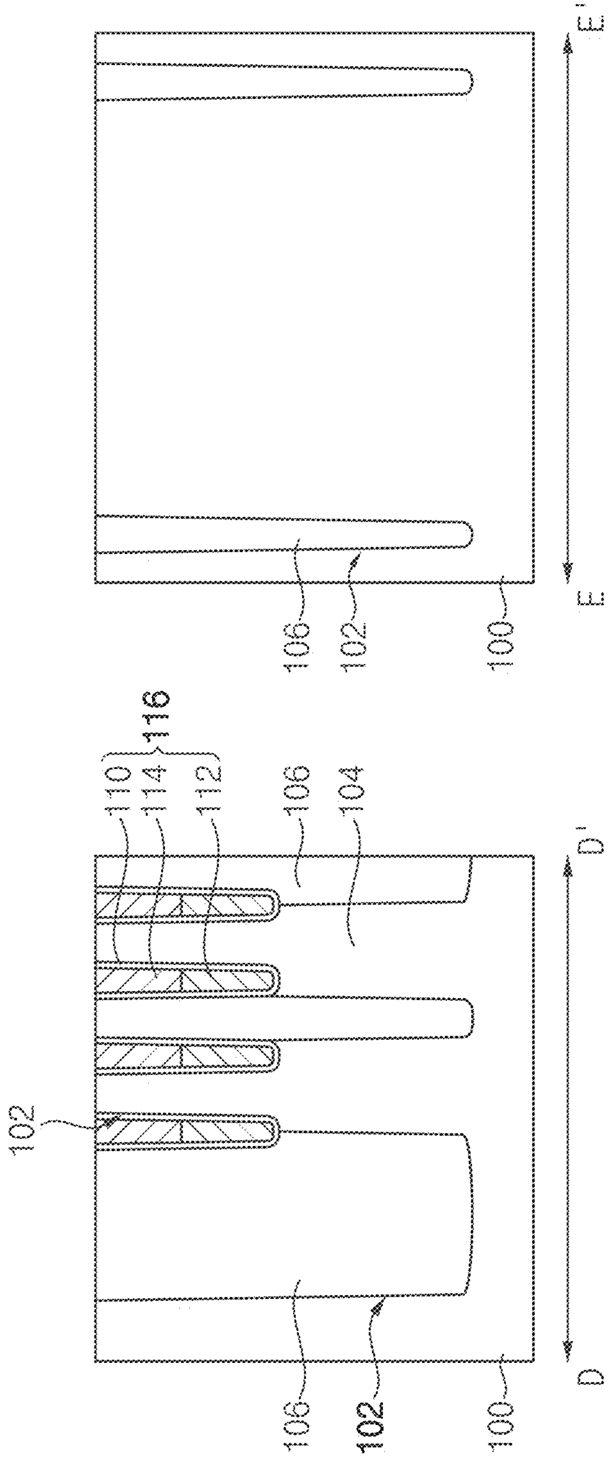

Referring to FIGS. 1 to 3, a substrate 100 may include a cell region I and a core/peripheral region II. The cell region I may be a region for forming or containing memory cells, and the core/peripheral region II may be a region for forming or containing peripheral circuits and/or core circuits. The core/peripheral region II may surround the cell region I.

An upper portion of the substrate 100 may be etched to form a trench 102, and an isolation pattern 106 may be formed to fill the trench 102, e.g. with a process such as a shallow trench isolation (STI) process. A portion of the substrate between the isolation patterns 106 may be defined as an active pattern 104. The isolation pattern 106 may serve as a field region, and an upper surface of the active pattern 104 may serve as an active region. The active region may be disposed such that the third direction may be a longitudinal direction.

In some example embodiments, a width of the isolation pattern 106 in the core/peripheral region II may be greater than a width of the isolation pattern 106 in the cell region I.

After forming an impurity region (not shown) at an upper portion of the cell region I of the substrate 100 by, e.g., an ion implantation process such as a beamline ion implantation process, the active pattern 104 and the isolation pattern 106 may be partially etched to form a first recess extending in the first direction.

Thereafter, a first gate structure 116 may be formed in the first recess. The first gate structure 116 may include a first gate insulation layer 110, a first gate electrode 112 and a lower capping pattern 114.

The first gate structure 116 may extend in the first direction, and a plurality of first gate structures 116 may be spaced apart from each other in the second direction.

Figure 4:
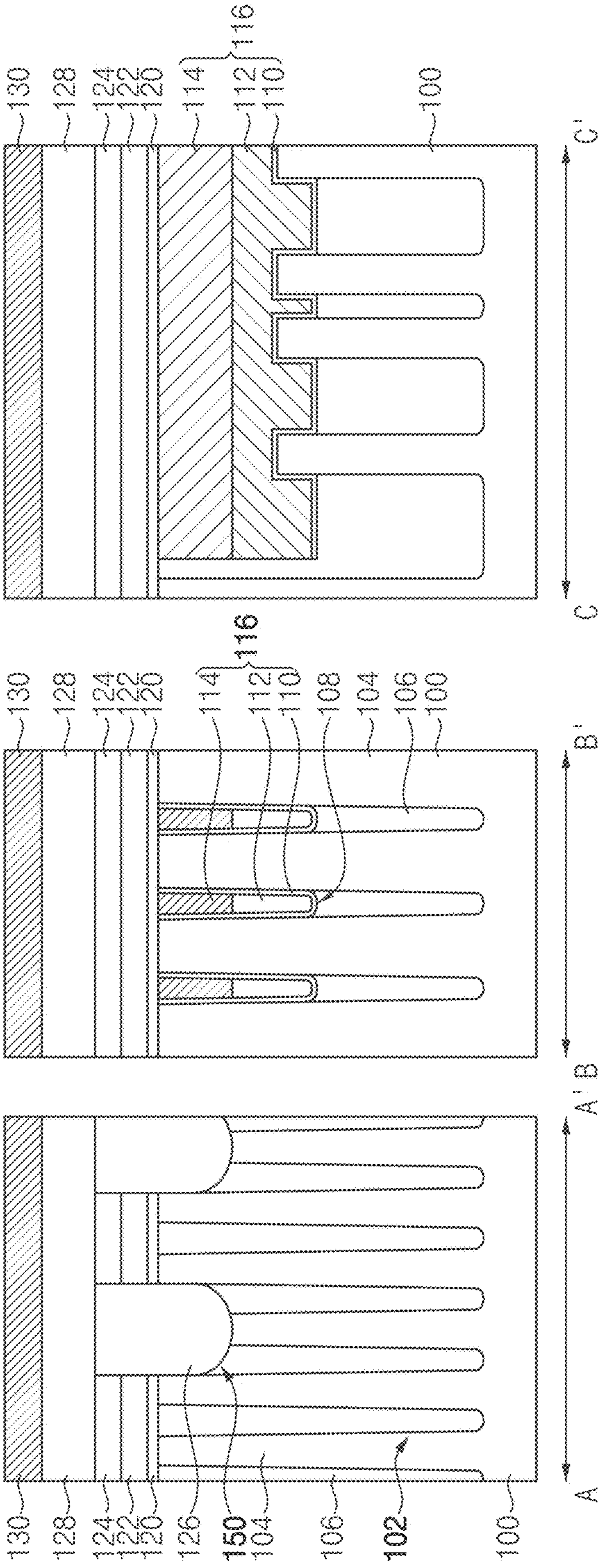

Referring to FIGS. 4 and 5, a first buffer insulation layer 120 and a second buffer insulation layer 122 may be sequentially formed on the active pattern 104, the isolation pattern 106 and the lower capping pattern 114 in the cell region I. The first and second buffer insulation layers 120 and 122 may be formed to insulate between conductive patterns (e.g., bit line structures) formed thereon and the active pattern. The first and second buffer insulation layers 120 and 122 may independently include an insulation material having an etch selectivity to each other.

A second gate insulation layer 121 may be formed on the active pattern 104 in, e.g. only in, the core/peripheral region II.

A first conductive layer 124 may be formed on the second buffer insulation layer 122 and the second gate insulation layer 121.

The first conductive layer 124, the second buffer insulation layer 122, the first buffer insulation layer 120 and upper portions of the active pattern 104 and the isolation pattern 106 in the cell region I may be etched to form a first opening 150 exposing the active pattern 104 on a bottom thereof. In some example embodiments, a middle portion in the longitudinal direction of each of the active patterns 104 in the cell region I may be exposed by the bottom of the first opening 150.

A second conductive layer 126 may be formed to fill the first opening 150. Upper surfaces of the first and second conductive layers 124 and 126 may be substantially coplanar with each other. The first and second conductive layers 124 and 126 may include polysilicon doped with impurities, and may be doped at the same, or different, concentrations of impurities. The first and second conductive layers 124 and 126 may be formed of the same material, so that the first and second conductive layers 124 and 126 may be merged into one lower conductive layer.

A barrier metal layer (not shown), a first metal layer 128 and a first capping layer 130 may be sequentially formed on an upper surface of the lower conductive layer. The first metal layer 128 may include, e.g., tungsten. The first capping layer may include, e.g., silicon nitride.

A first etching mask pattern (not shown) may be formed on the first capping layer 130 to cover the cell region I and expose a portion of the core/peripheral region II. The first capping layer 130, the first metal layer 128, the barrier metal layer and the first conductive layer 124 in the core/peripheral region II may be sequentially etched using the first etching mask pattern to form a second gate structure 142 and a preliminary bit line structure.

The second gate structure 142 may be formed in the core/peripheral region II. The second gate structure 142 may include the second gate insulation layer 121, a first conductive pattern **124*a*, a first metal pattern 128*a* and a first capping pattern 130*a* stacked. The preliminary bit line structure may be formed in the cell region I. The preliminary bit line structure may cover (e.g. partially or fully cover) the cell region I. The preliminary bit line structure may include the lower conductive layer, the first metal layer 128 and the first capping layer 130** stacked.

The preliminary bit line structure may extend to an edge of a core/peripheral region II adjacent to the cell region I. Thus, an end portion (e.g., a sidewall) of the preliminary bit line structure may be positioned in the core/peripheral region II.

A spacer 136 may be formed on a sidewall of the preliminary bit line structure and a sidewall of the second gate structure 142. In an etching process for forming the spacer 136, the first buffer insulation layer 120, the second buffer insulation layer 122, and the second gate insulation layer 121 between the spacers 136 may be removed, e.g. removed concurrently or together.

In some example embodiments, a nitride liner (not shown) may be further formed on an upper surface of the preliminary bit line structure, an upper surface of the second gate structure 142, surfaces of the spacer 136 and the substrate 100 therebetween. The nitride liner may include, e.g., silicon nitride.

An upper portion of the active pattern 104 adjacent to the second gate structures 142 may be doped with impurities to form an impurity region 144 serving as a source/drain. The second gate structure 142 and the impurity region 144 may serve as a transistor.

Figure 7:
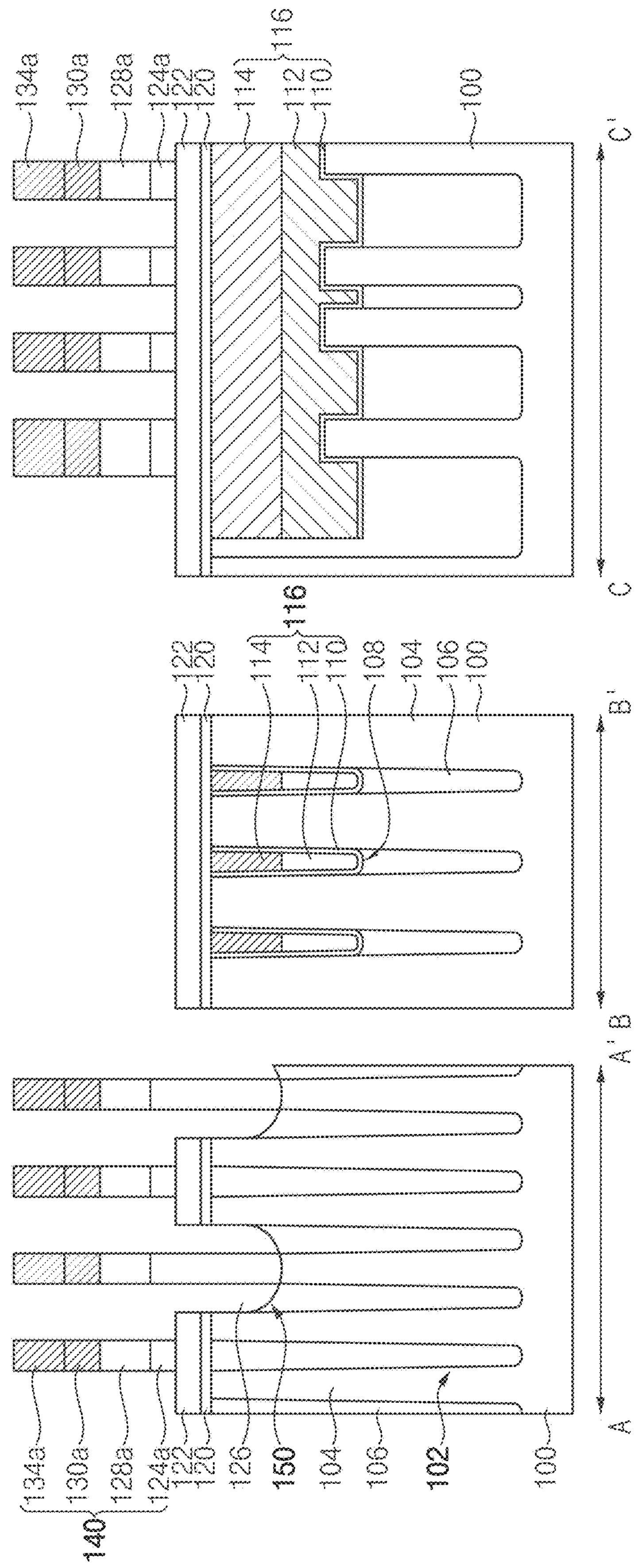
Figure 8:
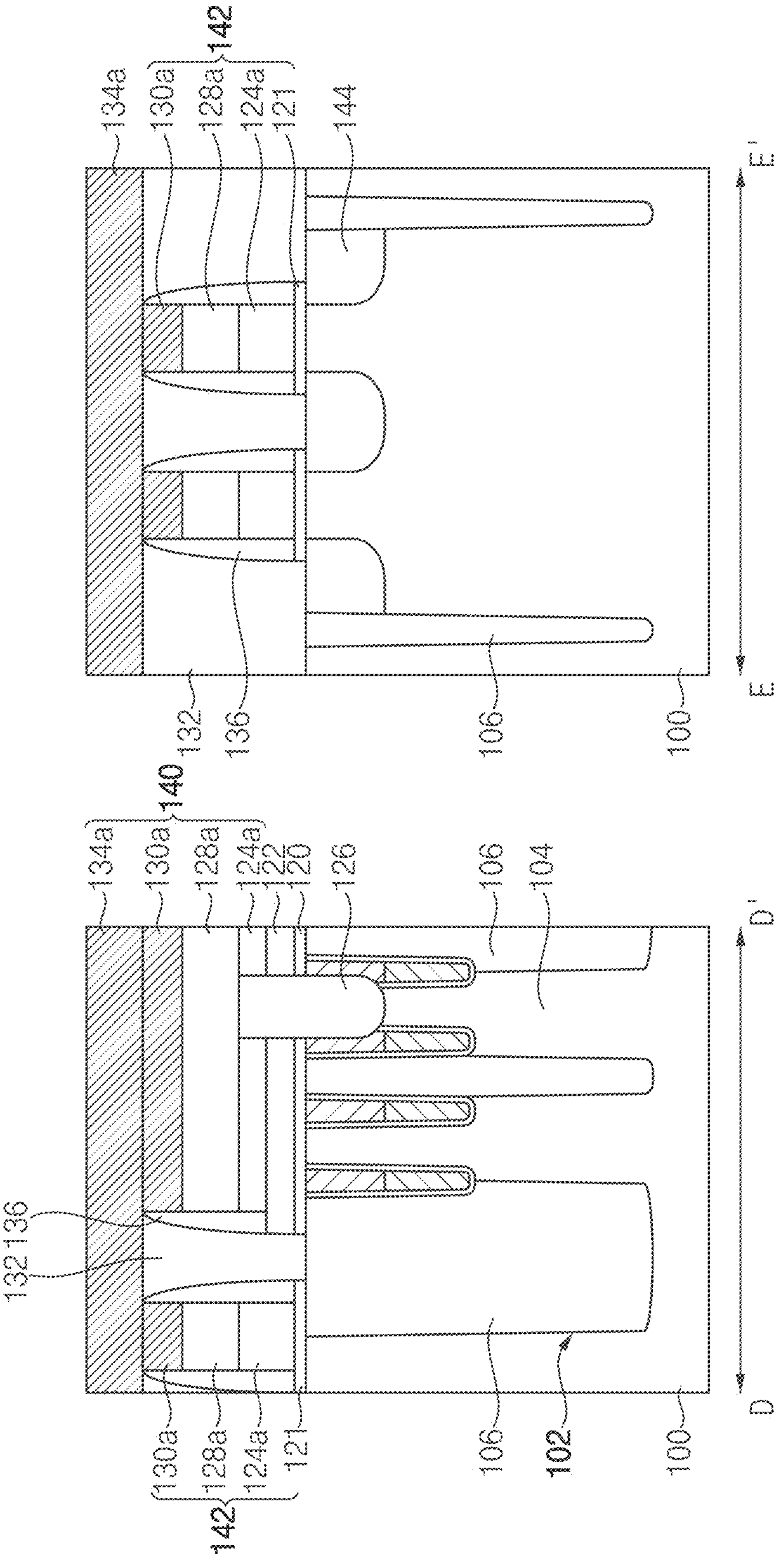

Referring to FIGS. 6 to 8, a lower insulating interlayer 132 may be formed to fill a space between the second gate structures 142 in the core/peripheral region II of the substrate 100.

A second capping layer may be formed on the preliminary bit line structure, the second gate structure 142 and the lower insulating interlayer 132. The second capping layer may include, e.g., silicon nitride. In some example embodiments, the first capping layer 130, the nitride liner, and the second capping layer may include the same material such as silicon nitride, and thus the first capping layer 130, the nitride liner, and the second capping layer may be merged into one nitride layer, e.g. one homogenous nitride layer.

The second capping layer and the first capping layer 130 in the cell region I may be patterned to form a second capping pattern 134*a* and a first capping pattern 130*a* in the cell region I and the core/peripheral region II. The first and second capping patterns 130*a* and 134*a* in the cell region I may have a line or linear shape extending in the second direction. The second capping pattern 134*a* may cover an entire upper portion of the core/peripheral region II.

The first metal layer 128, the barrier metal layer, the second conductive layer 126 and the first conductive layer 124 in the cell region I may be etched using the first and second capping patterns 130*a* and 134*a* as an etching mask. Accordingly, a first conductive pattern 124*a*, a barrier metal pattern (not shown), a first metal pattern 128*a*, and the first and second capping patterns 130*a* and 134*a* sequentially stacked may be formed on the active pattern 104 exposed by the first opening 150. In addition, the first conductive pattern 124*a*, the barrier metal pattern (not shown), the first metal pattern 128*a*, and the first and second capping patterns 130*a* and 134*a* sequentially stacked may be formed on the second buffer insulation layer 122 outside the first opening 150. As the first and second conductive layers 124 and 126 may be formed of the same material, and thus a conductive pattern formed by patterning the first and second conductive layers is referred to as the first conductive pattern 124*a*. In some example embodiments, a doping concentration of first conductive layer 124 may be the same as, or different than (e.g. greater than or less than), a doping concentration of the second conductive pattern 126; however, example embodiments are not limited thereto.

The first conductive pattern 124*a*, barrier metal pattern, first metal pattern 128*a*, first capping pattern 130*a*, and second capping pattern 134*a* sequentially stacked may serve as a bit line structure 140.

The bit line structure 140 may extend in the second direction, and a plurality of bit line structures 140 may be spaced apart from each other in the first direction. The bit line structure 140 may contact the active pattern 104 exposed by the first opening 150.

Figure 9:
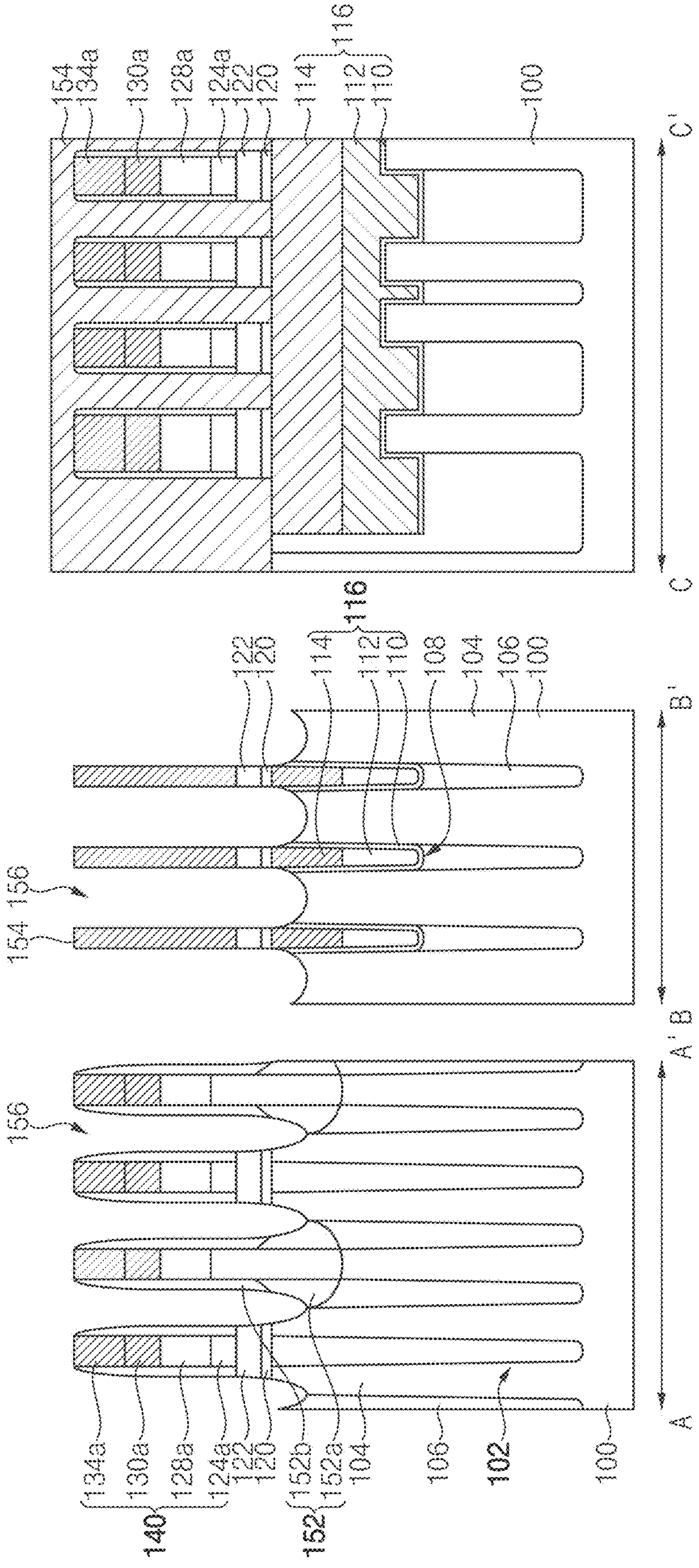

Referring to FIG. 9, a spacer structure 152 may be formed to cover a sidewall of the bit line structure 140.

As shown in FIG. 9, the spacer structure 152 may include a plurality of spacers that are laterally stacked.

In some example embodiments, the spacer structure 152 may include a first spacer 152*a* covering a lower sidewall of the bit line structure 140 positioned in the first opening, a second spacer 152*b* on a top portion of the first spacer 152*a* to cover an upper sidewall of the bit line structure 140. In addition, third and fourth spacers (not shown) may be sequentially formed on a surface of the second spacer 152*b*.

However, a configuration of the spacer structure 152 may not be limited thereto, and the spacer structure 152 may include only a single spacer or two or more spacers.

A first insulating interlayer (not shown) may be formed to fill a gap between the spacer structures 152. After forming a second etching mask pattern (not shown) on the first insulating interlayer and the spacer structure 152, the first interlayer insulating layer may be etched using the second etching mask pattern to form a second opening (not shown).

In some example embodiments, the second etching mask pattern may extend in the first direction, and a plurality of the second etching mask pattern may be spaced apart from each other in the second direction. In this case, the second opening may be formed to overlap the first gate structure 116.

Thereafter, a fence insulation pattern 154 may be formed to fill the second opening. The fence insulation pattern 154 may be formed on the first gate structure 116. The fence insulation pattern 154 may include, e.g., a nitride such as silicon nitride.

The first insulating interlayer may be etched, and the second buffer insulation layer 122, the first buffer insulation layer 120, and a surface of the substrate 100 thereunder may be etched to form a third opening 156 exposing the surface of the substrate 100. The third opening 156 may be formed between the bit line structure 140 and the fence insulation pattern 154.

Figure 10:
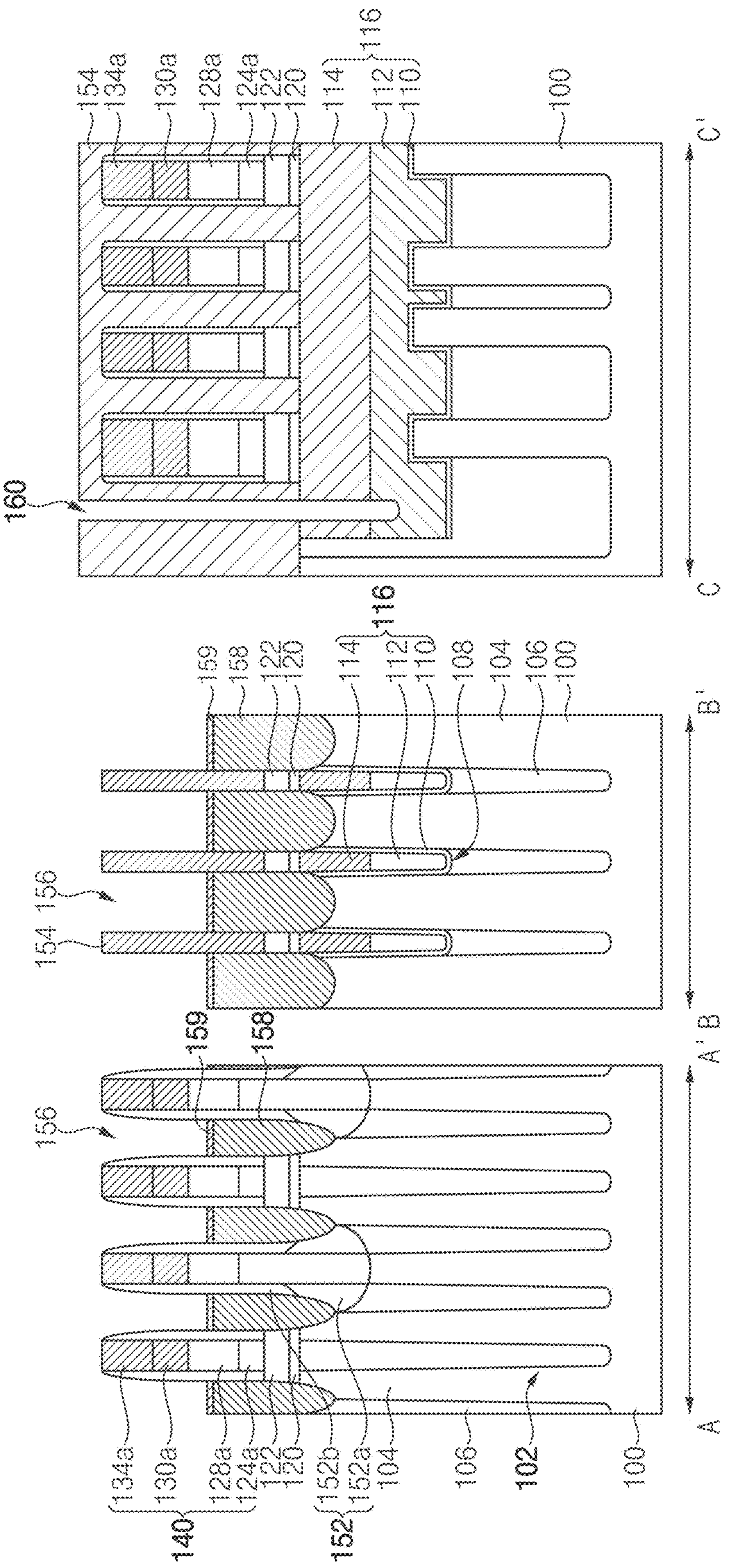
Figure 11:
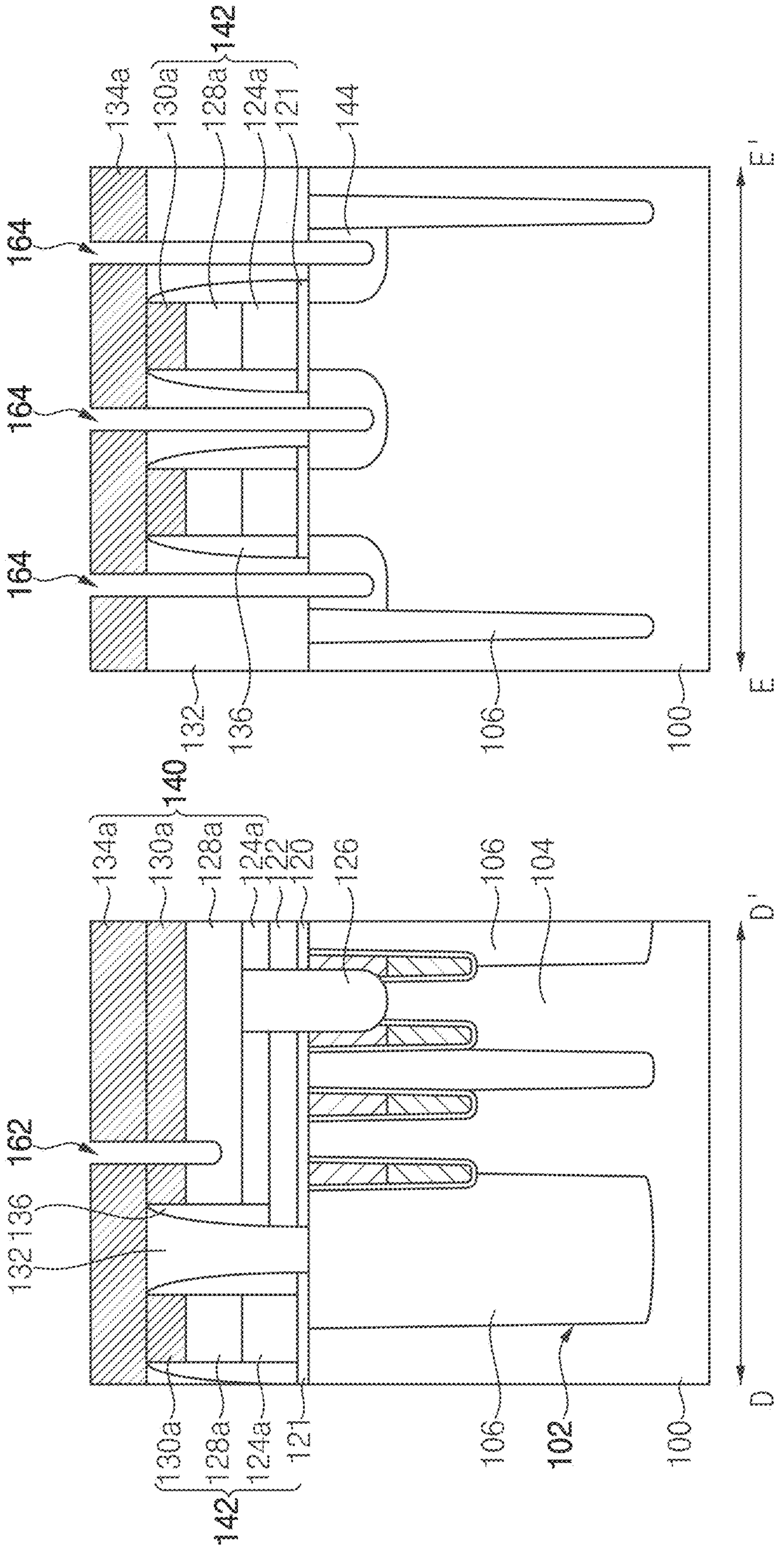

Referring to FIGS. 10 and 11, a lower contact plug 158 may be formed to fill a lower portion of the third opening 156.

In some example embodiments, a conductive layer may be formed to fill the third opening 156, and then an upper portion of the conductive layer may be removed to form the lower contact plug 158. The removing of the upper portion of the conductive layer may include an etch-back process. The conductive layer may include polysilicon doped with impurities. When the conductive layer is formed of the polysilicon, the conductive layer may easily fill the third opening 156 having a high aspect ratio.

In some example embodiments, a silicide pattern 159 may be formed on the lower contact plug 158. The silicide pattern 159 may include cobalt silicide; however, example embodiments are not limited thereto, and the silicide pattern 15 may include nickel silicide.

A third etching mask pattern (not shown) may be formed on structures in the cell region I and the core/peripheral region II. The third etch mask pattern may cover an entire upper portion of the cell region I. The third etching mask pattern may expose a region for forming contact holes in the core/peripheral region II.

Thereafter, layers exposed by the third etching mask pattern may be etched using the third etching mask pattern to form first to third contact holes 160, 162 and 164 in the core/peripheral region II.

For example, the first contact hole 160 exposing the first conductive pattern 124*a* of the bit line structure 140 may be formed in the core/peripheral region II adjacent to the cell region I. The second contact holes 162 exposing source/drain regions adjacent to both sides of the second gate structure 142 may be formed in the core/peripheral region II. In addition, the third contact hole 164 exposing the first gate electrode 112 of the first gate structure 116 may be formed in the core/peripheral region II adjacent to the cell region I.

The first to third contact holes 160, 162, and 164 may have different vertical depths to each other. The first to third contact holes 160, 162, and 164 may have bottom surfaces on different planes. In some example embodiments, the first to third contact holes 160, 162, and 164 may be formed by performing photo processes and etching processes of several times, e.g. performing a first photo/etch process to form the first contact holes 160, performing a second photo/etch process to form the second contact holes 162, and performing a third photo/etch process to form the third contact holes 164.

Through the above process, a space of the third opening 156 on the lower contact plug 158 may remain in the cell region (I), and the first to third contact holes 160, 162, and 164 may be formed in the core/peripheral region II.

Figure 12:
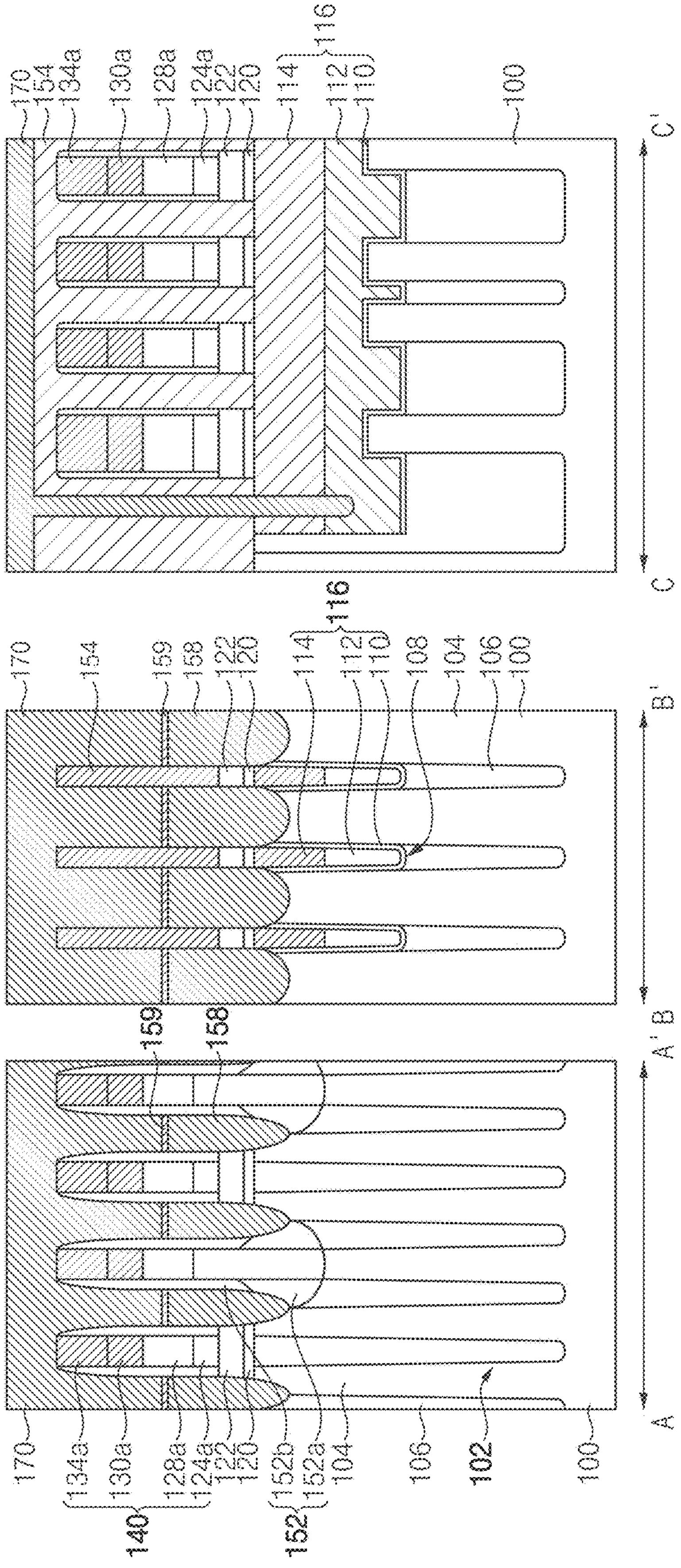
Figure 13:
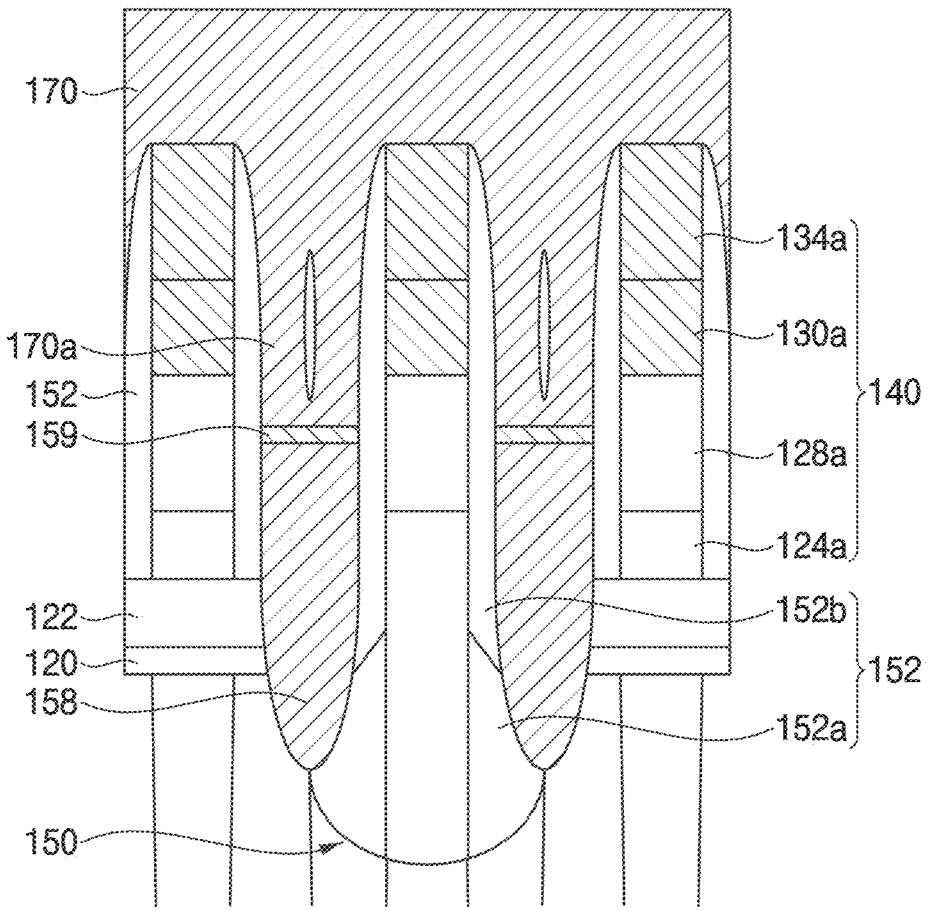
Figure 14:
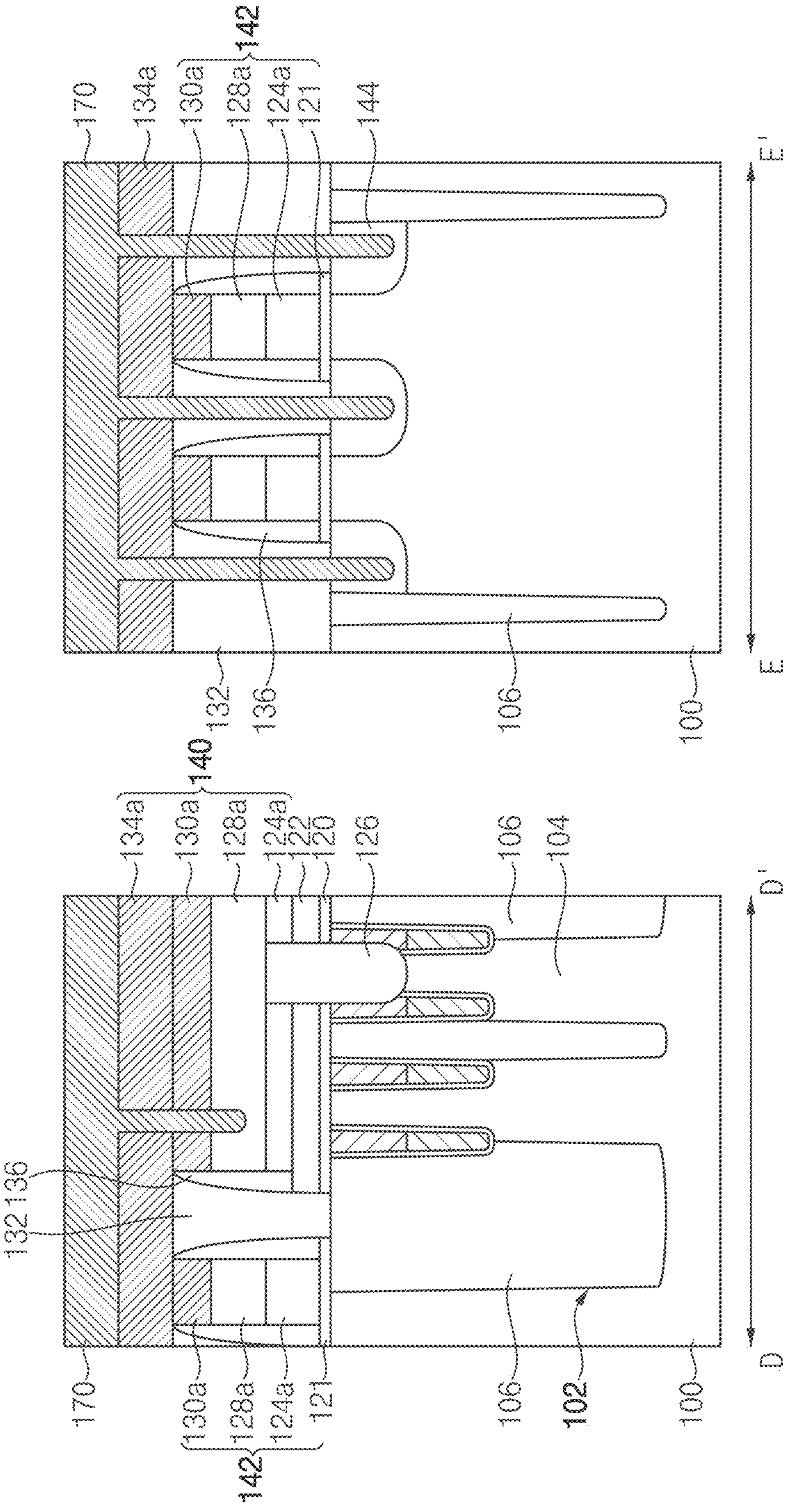

Referring to FIGS. 12 to 14, a first barrier metal layer 170 may be formed on the silicide pattern 159, the bit line structure 140 and the spacer structure 152 of the cell region I and the second capping pattern 134*a* of the core/peripheral region II. The first barrier metal layer 170 may fill the third opening 156 and the first to third contact holes 160, 162, and 164.

The first barrier metal layer 170 may completely fill the third opening 156. Accordingly, an upper surface of the first barrier metal layer 170 may be higher than an upper surface of the bit line structure 140.

The first barrier metal layer 170 may include, e.g., a metal such as titanium (Ti) and tantalum (Ta) and/or metal nitrides such as titanium nitride (TiN) and/or tantalum nitride (TaN).

In some example embodiments, when the third opening 156 has the high aspect ratio, a void or a seam may be included in the first barrier metal layer 170 filling the third opening 156. In some example embodiments, a void or a seam may also be included in the first barrier metal layer 170 filling at least one of the first to third contact holes 160, 162 and 164.

In some example embodiments, the void may not be included in the first barrier metal layer 170.

Figure 15:
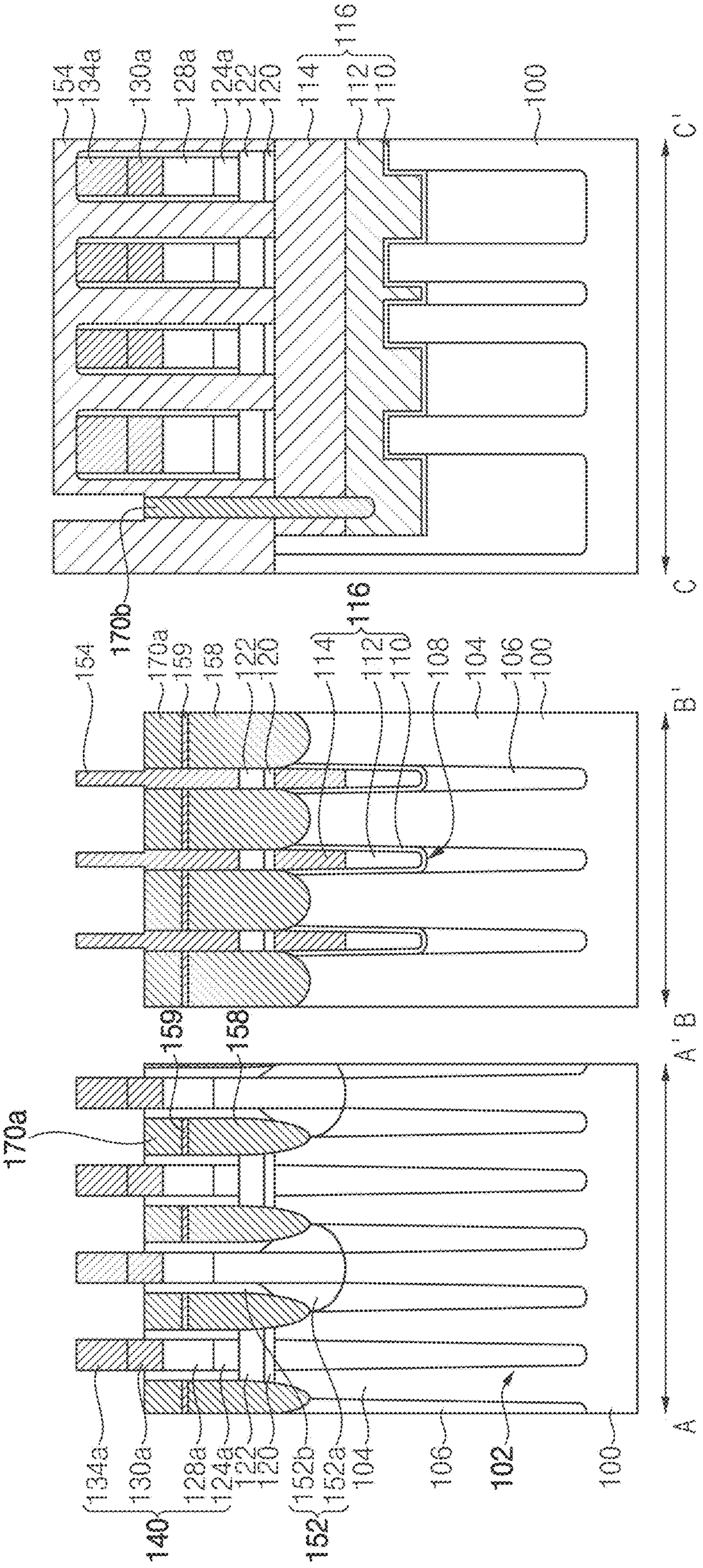
Figure 16:
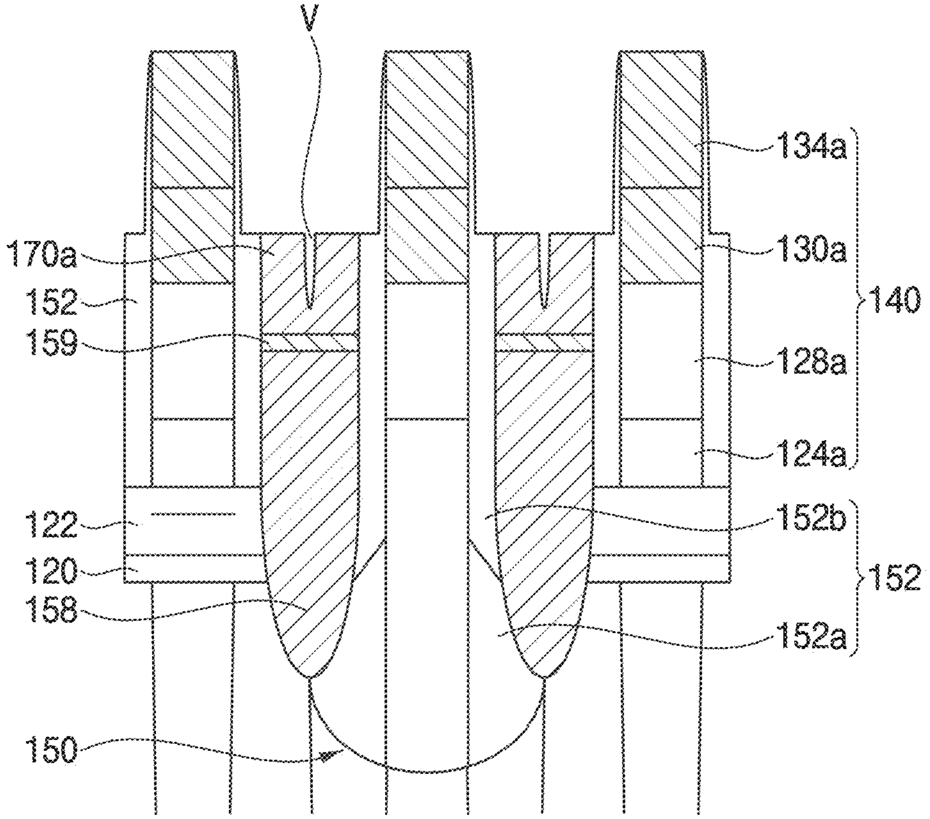
Figure 17:
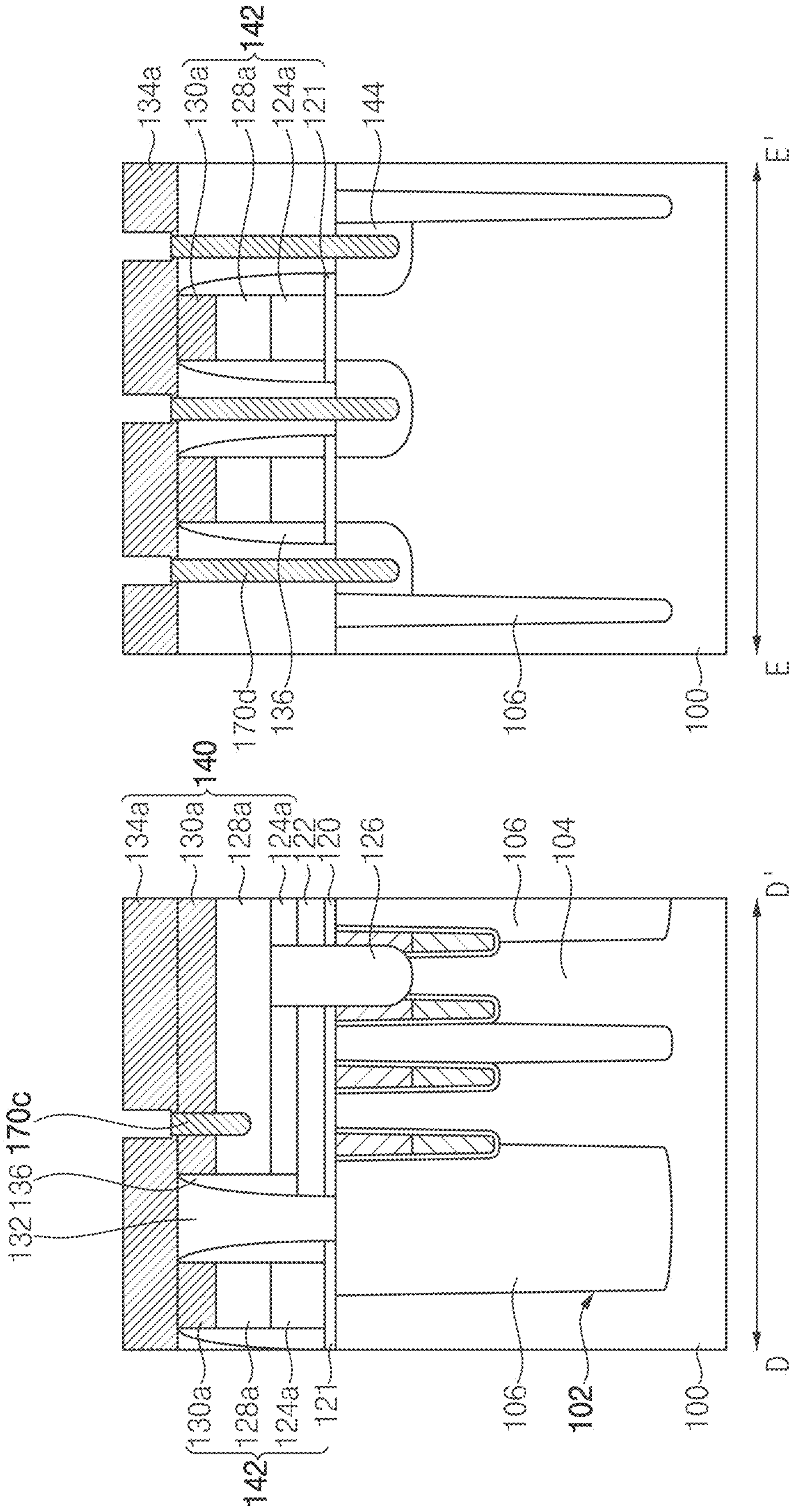

Referring to FIGS. 15 to 17, the first barrier metal layer 170 may be etched back and/or planarized so that the upper surface of the first barrier metal layer 170 may be at least lower than upper surface of the bit line structure 140. Therefore, first to fourth barrier metal patterns 170*a*, 170*b*, 170*c*, and 170*d* may be formed inside of the third opening 156 and the first to third contact holes 160, 162, and 164, respectively.

During the etch-back process, the spacer structure 152 on an upper sidewall of the bit line structure 140 may be partially removed together. Accordingly, an inner width of the third opening 156 between the bit line structures 140 may be increased.

The upper surface of the first barrier metal pattern 170*a* in the third opening 156 may be lower than an uppermost portion of the third opening 156. An upper surface of the second barrier metal pattern 170*b* in the first contact hole 160 may be lower than an uppermost portion of the first contact hole 160. An upper surface of the third barrier metal pattern 170*c* in the second contact hole 162 may be lower than an uppermost part of the second contact hole 162. An upper surface of the fourth barrier metal pattern 170*d* in the third contact hole 164 may be lower than an uppermost portion of the third contact hole 164.

Each of or at least one of the first to fourth barrier metal patterns 170*a*, 170*b*, 170*c*, and 170*d* may have a pillar shape.

The upper surface of the first barrier metal pattern 170*a* in the cell region I may be lower than a lower surface of a second upper insulation pattern between landing pad structures subsequently formed (to be described below).

In some example embodiments, the seam or void v may be opened and included in the first barrier metal layer 170. In this case, the seam or void v or seam in the first barrier metal layer 170 may be opened by the etch-back process, so that an upper portion of the first barrier metal pattern 170*a* may have an opened void.

As the first barrier metal pattern 170*a* may be partially filled in the third opening 156 in the cell region I, a vertical height of a remaining space of the third opening 156 on the first barrier metal pattern 170*a* may be decreased. Alternatively or additional, the inner width of the third opening 156 may be expanded by partially removing the spacer structure 152. Accordingly, the aspect ratio of the remaining space of the third opening 156 may be decreased, and a manufacturing process may be improved.

As the second to fourth barrier metal patterns 170*b*, 170*c*, and 170*d* may be formed in the first to third contact holes 160, 162, and 164 in the core/peripheral region II, respectively, a vertical height of a remaining space of each of the first to third contact holes 160, 162 and 164 on the second to fourth barrier metal pattern 170*b*, 170*c* and 170*d* may be decreased. Accordingly, the aspect ratio of the remaining space of each of the first to third contact holes 160, 162 and 164 may be decreased, and a manufacturing process may be improved.

Figure 18:
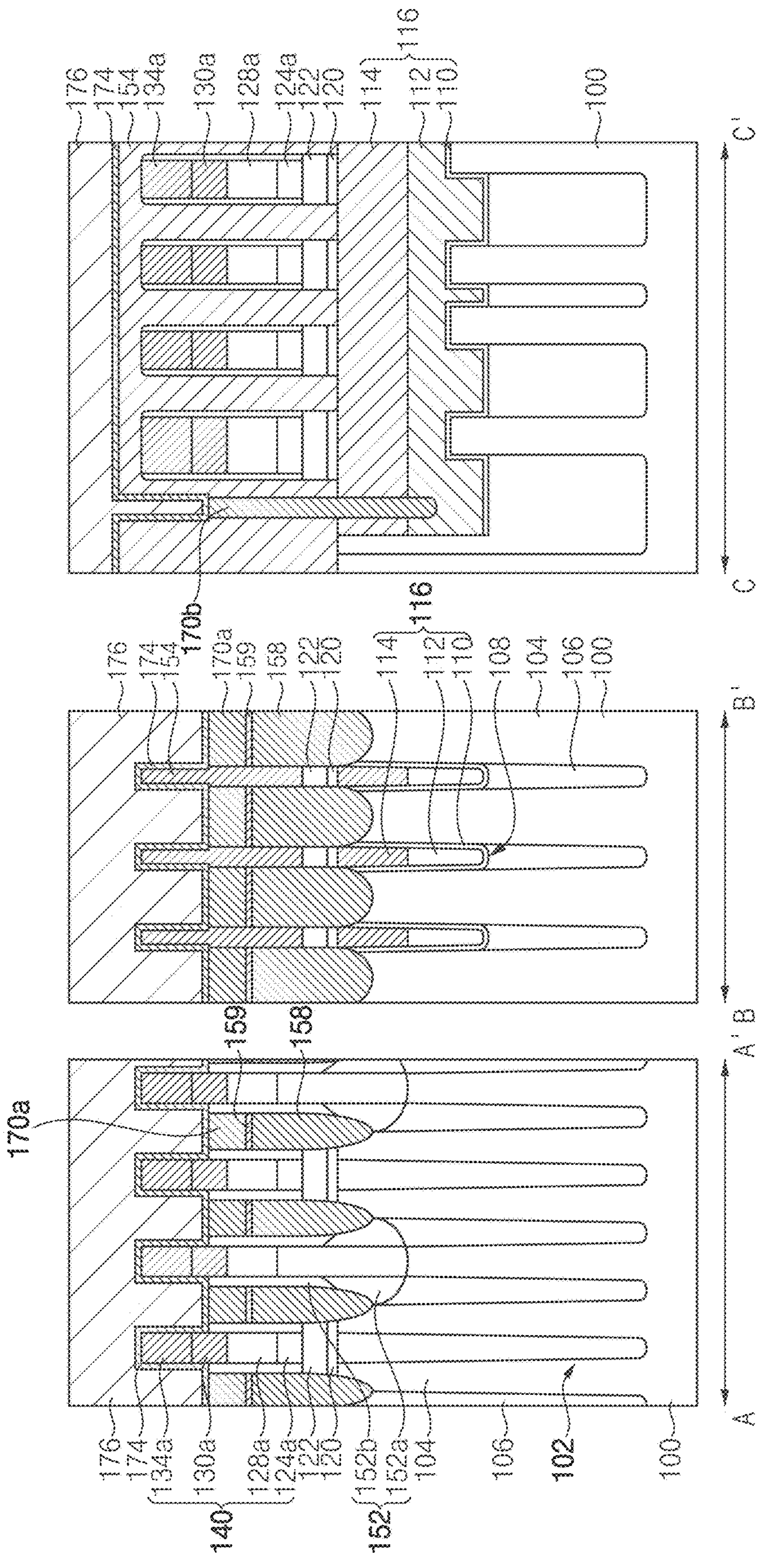
Figure 19:
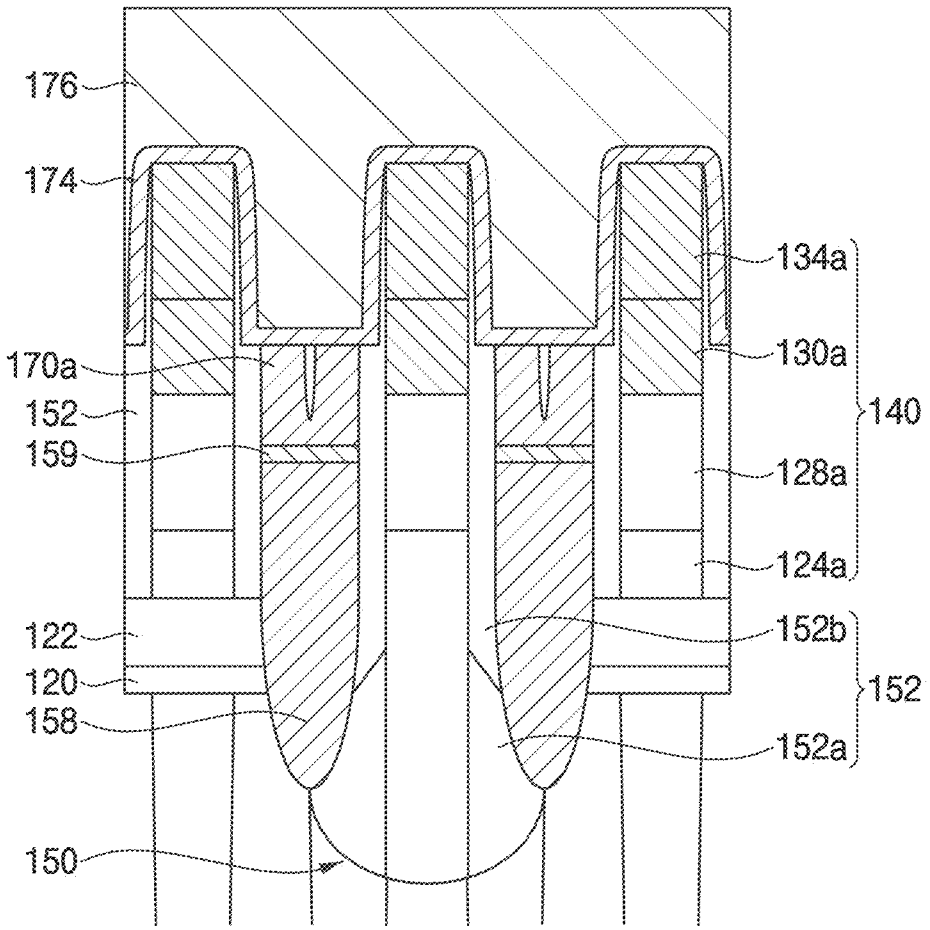
Figure 20:
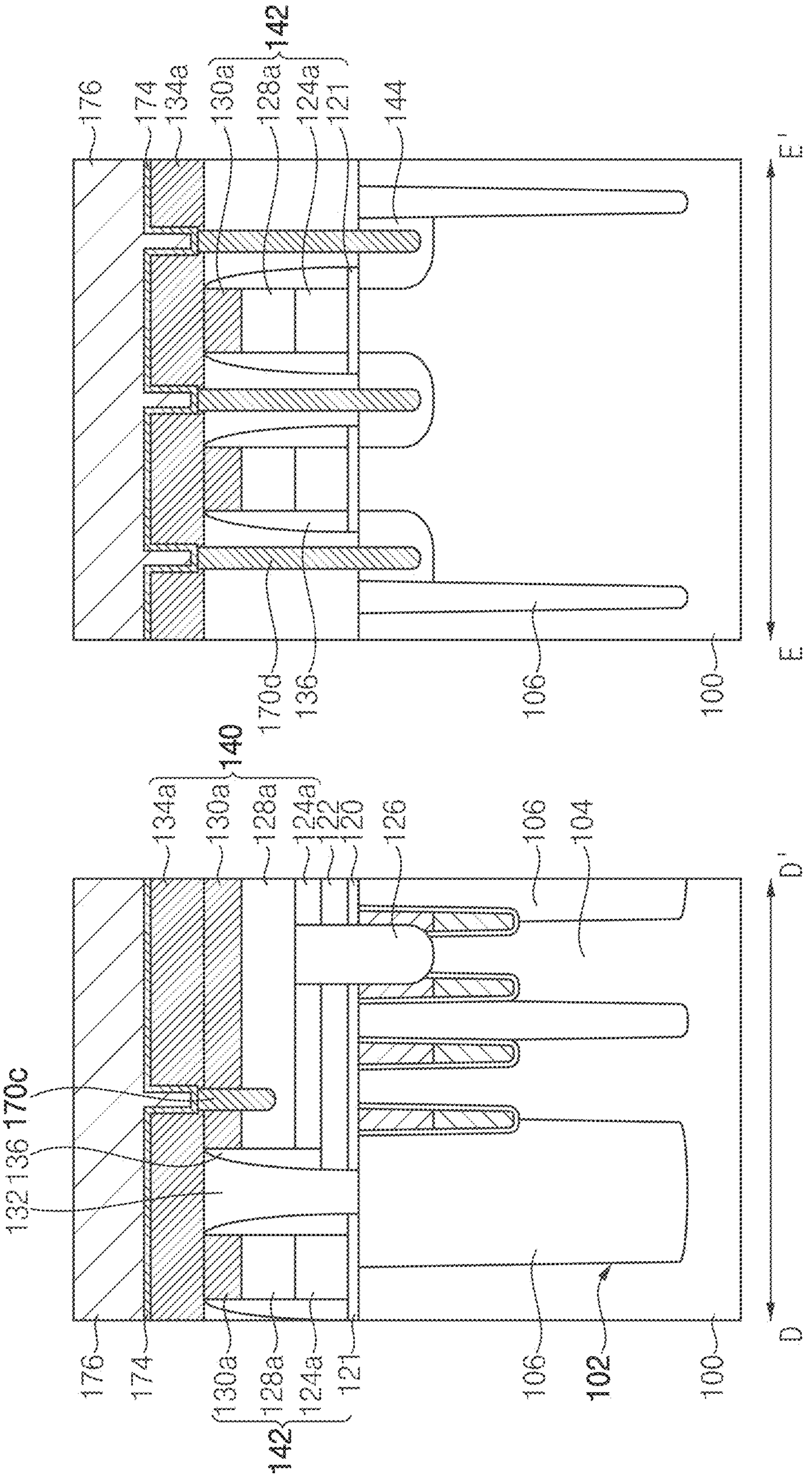

Referring to FIGS. 18 to 20, a second barrier layer 174 may be conformally formed on the bit line structure 140 and the first barrier metal pattern 170*a* of the cell region I and the second capping pattern 134*a* and the second to fourth barrier metal patterns 170*b*, 170*c*, and 170*d* of the core/peripheral region II. The second barrier layer 174 may be formed along the surfaces of the third opening 156 and the first to third contact holes 160, 162, and 164.

The second barrier metal layer 174 may include, e.g., a metal such as titanium (Ti) and/or tantalum (Ta) and/or a metal nitride such as titanium nitride and/or tantalum nitride.

In the cell region I, when the upper portion of the first barrier metal pattern 170*a* has the opened void, the second barrier metal layer 174 may cover the void v. Therefore, an entrance of the void v may be closed by the second barrier metal layer 174.

A first metal layer 176 may be formed on the second barrier metal layer 174 to completely fill the third opening 156 and the first to third contact holes 160, 162 and 164. The first metal layer 176 may be formed as a landing pad structure 184 in the cell region I and an upper wiring in the core/peripheral region II, respectively, through subsequent processes. Therefore, the upper surface of the first metal layer 176 may be formed higher than at least the upper surfaces of the bit line structure 140 and the upper surfaces of the second capping pattern 134*a*.

The first to fourth barrier metal patterns 170*a*, 170*b*, 170*c*, and 170*d* may be already and partially filled in the third opening 156 and the first to third contact holes 160, 162, and 164, respectively. Therefore, spaces of the third opening 156 and the first to third contact holes 160, 162, and 164 for filling the first metal layer 176 may have a low aspect ratio. Thus, a void may not be formed, or may be less likely to be formed, in the first metal layer 176. Further, the third opening 156 may be sufficiently expanded in the etch-back process of the first barrier layer, so that the third opening 156 may have a wide inner width. Therefore, the void may not be formed, or may be less likely to be formed, in the first metal layer 176 in the third opening 156.

The first metal layer 176 may include, e.g., tungsten.

Figure 21:
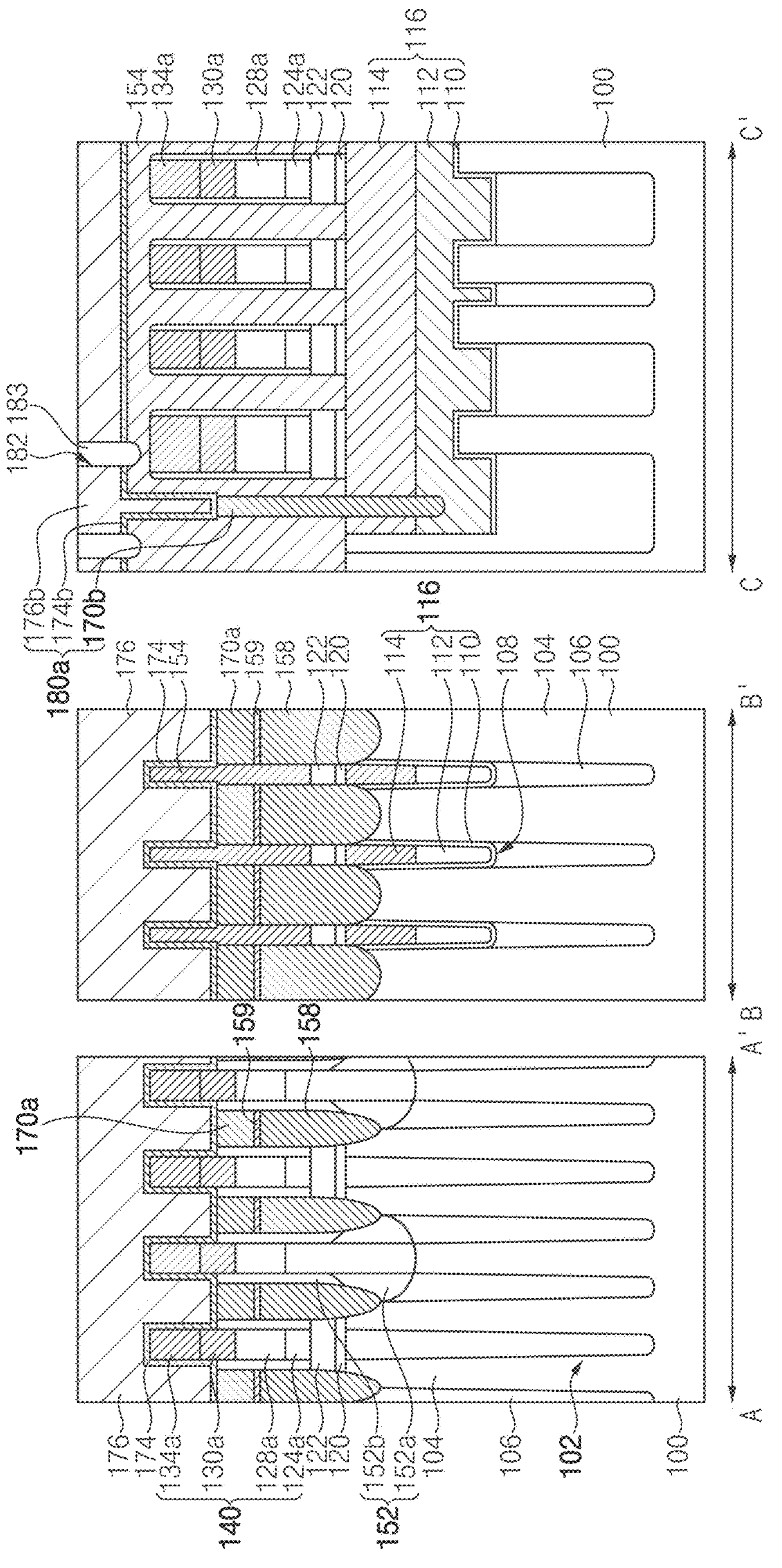

Referring to FIGS. 21 and 22, a fourth etching mask pattern (not shown) may be formed on the first metal layer 176.

The fourth etch mask pattern may serve as a mask for forming wiring patterns in the core/peripheral region II. The fourth etching mask pattern may cover entire of the first metal layer 176 in the cell region I. In addition, the fourth etching mask pattern may at least cover or partially cover upper portions of first to third contact holes 160, 162, and 164 in the core/peripheral region II.

The first metal layer 176 and the second barrier metal layer 174 may be etched, e.g. may be anisotropically etched using the fourth etching mask pattern, and then an upper portion of the second capping pattern 134*a* in the core/peripheral region II may be partially etched to form barrier metal patterns and metal patterns. The barrier metal patterns and metal patterns may be formed on the second capping pattern 134*a* to fill the first to third contact holes 160, 162, and 164 in the core/peripheral region II. In some example embodiments, the metal patterns formed on the second capping pattern 134*a* may have a line shape.

Through the above process, a first wiring 180*a* including the second barrier metal pattern 170*b*, the fifth barrier metal pattern 174*b* and the third metal pattern 176*b* stacked may be formed in the first contact hole and on the second capping pattern 134*a*. The second barrier metal pattern 170*b* may fill a lower portion of the first contact hole 160. The fifth barrier metal pattern 174*b* may cover an upper surface of the second barrier metal pattern 170*b*, and may be formed along a sidewall of the first contact hole 160 and an upper surface of the second capping pattern 134*a*.

A second wiring 180*b* including a third barrier metal pattern 170*c*, a sixth barrier metal pattern 174*c*, and a fourth metal pattern 176*c* stacked may be formed in the second contact hole 162 and on the second capping pattern 134*a*. The third barrier metal pattern 170*c* may fill a lower portion of the second contact hole 162. The sixth barrier metal pattern 174*c* may cover an upper surface of the third barrier metal pattern 170*c*, and may be formed along a sidewall of the second contact hole 162 and the upper surface of the second capping pattern 134*a*.

A third wiring 180*c* including a fourth barrier metal pattern 170*d*, a seventh barrier metal pattern 174*d* and a fifth metal pattern 176*d* stacked may be formed in the third contact hole 164 and on the second capping pattern 134*a*. The fourth barrier metal pattern 170*d* may fill a lower portion of the third contact hole 160. The seventh barrier metal pattern 174*d* may cover an upper surface of the fourth barrier metal pattern 170*d*, and may be formed along a sidewall of the third contact hole 164 and the upper surface of the second capping pattern 134*a*.

When the etching process is performed, a fourth opening 182 may be formed between the wirings.

Thereafter, a first upper insulation pattern 183 may be formed to fill the fourth opening 182 between the wirings. The first upper insulation pattern 183 may include, e.g., silicon oxide.

Figure 24:
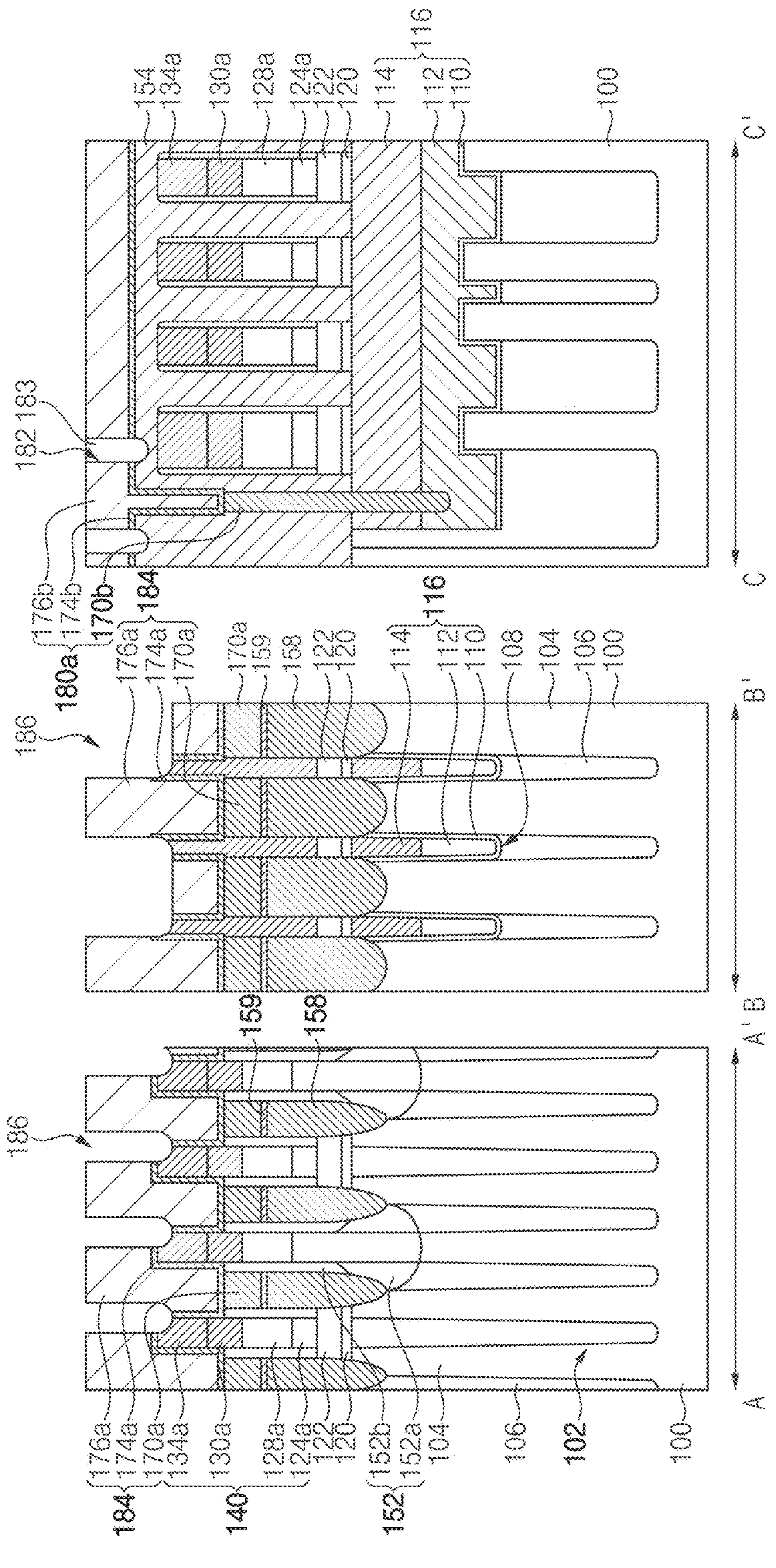

Referring to FIGS. 23 and 24, a fifth etching mask pattern (not shown) may be formed on the first metal layer 176, the third to fifth metal patterns 176*b*, 176*c*, and 176*d*, and the first upper insulation pattern 183.

The fifth etch mask pattern may serve as a mask for forming the landing pad structure 184 in the cell region I. The fifth etch mask pattern may cover entire of the third to fifth metal patterns 176*b*, 176*c* and 176*d* and the first upper insulation pattern 183 in the core/peripheral region II. In addition, the fifth etch mask pattern may selectively cover or at least partially cover a portion for forming the landing pad structure 184 in the cell region I.

The first metal layer 176 and the second barrier metal layer 174 in the cell region I may be anisotropically etched using the fifth etch mask pattern, and then upper portions of the second capping pattern 134*a* and the spacer structure 152 in the cell region I may be partially etched to form an eighth barrier metal pattern 174*a* and a second metal pattern 176*a* on the first barrier metal pattern 170*a*.

Accordingly, the landing pad structure 184 including the first barrier metal pattern 170*a*, the eighth barrier metal pattern 174*a*, and the second metal pattern 176*a* may be formed on the silicide pattern 159 in the cell region I. In addition, a fifth opening 186 may be formed between upper portions of the landing pad structures 184.

Upper portions of the second capping pattern 134*a* of the bit line structure 140 and the spacer structure 152 may include a recess formed by the fifth opening 186. An upper surface of the first barrier metal pattern 170*a* may be lower than a lower surface of the recess.

In the landing pad structure 184, the first barrier metal pattern 170*a* may be formed on silicide pattern 159 to partially fill the third opening 156. The eighth barrier metal pattern 174*a* may be conformally formed on upper surfaces of the first barrier metal pattern 170*a*, the spacer structure 152, and the bit line structure 140. The second metal pattern 176*a* may be formed on the eighth barrier metal pattern 174*a*. For example, the eighth barrier metal pattern 174*a* may be formed to cover the upper surface of the first barrier metal pattern 170*a* of the landing pad structure 184.

An uppermost surface of the eighth barrier metal pattern 174*a* may be higher than a lowermost surface of the second metal pattern 176*a*. An uppermost surface of the first barrier metal pattern 170*a* may be lower than the lowermost surface of the second metal pattern 176*a*. A void may not be included, or may less likely be included, in the second metal pattern 176*a*.

In the landing pad structure 184, a lower width of a structure in which the eighth barrier metal pattern 174*a* and the second metal pattern 176*a* are stacked may be greater than an upper width of the first barrier metal pattern 170*a*.

Figure 25:
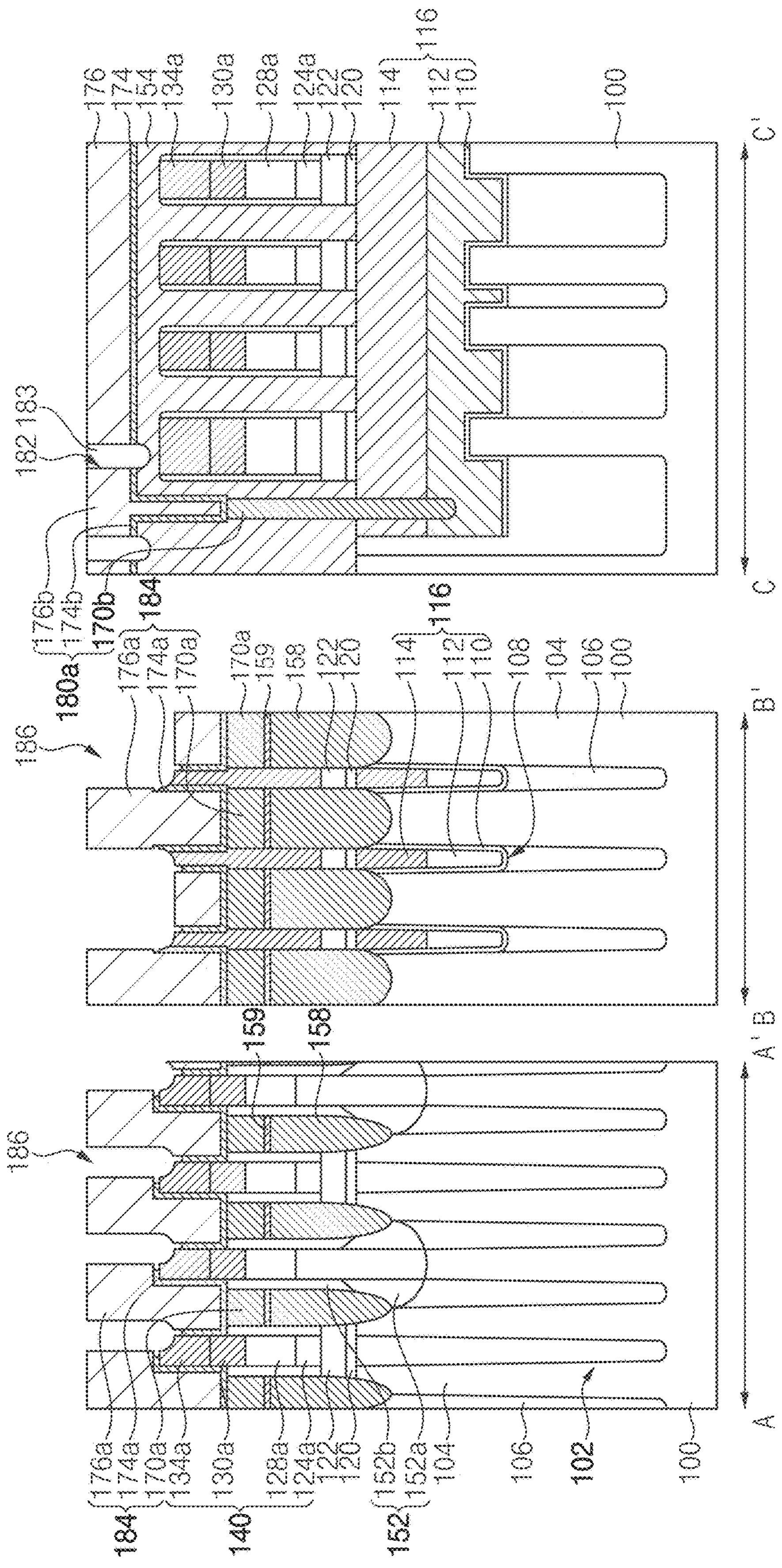
Figure 26:
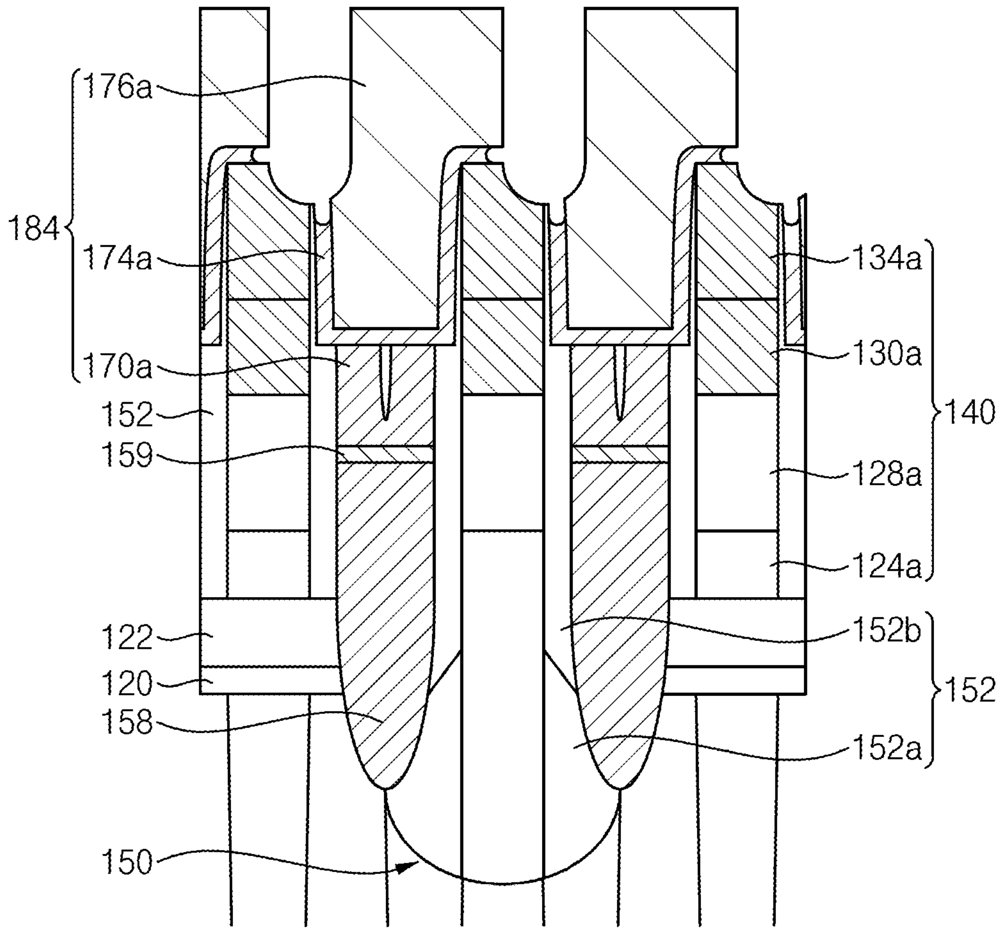

Referring to FIGS. 25 and 26, a wet cleaning process may be performed to remove a metal residue between the second metal patterns 176*a* and on the second metal patterns 176*a* the exposed by the fifth opening 186.

In some example embodiments, the wet cleaning process may be performed using a chemical containing hydrogen fluoride (HF) such as a buffered HF mixture. As the metal residue between the second metal patterns 176*a* may be removed by the wet cleaning process, defects in which adjacent second metal patterns 176*a* are electrically connected to each other due to the metal residue may be decreased.

An edge portion of the eighth barrier metal pattern 174*a* may be exposed by the fifth opening 186. For example, an end portion of the eighth barrier metal pattern 174*a* contacting an uppermost portion of the bit line structure 140 and an end portion of the eighth barrier metal pattern 174*a* contacting one upper wall of the spacer structure 152 may be exposed by the fifth opening 186. In the wet cleaning process, the exposed end portions of the eighth barrier metal pattern 174*a* may be partially etched. Accordingly, the eighth barrier metal pattern 174*a* may have recessed portions from the second metal pattern 176*a* thereon. For example, the end portion of the eighth barrier metal pattern 174*a* contacting the uppermost portion of the bit line structure 140 may have an undercut shape from a sidewall of the upper second metal pattern 176*a*. The end portion of the eighth barrier metal pattern 174*a* contacting the one upper wall of the spacer structure 152 may have the recessed portion in a direction toward the substrate 100.

A distance between the end portion of the eighth barrier metal pattern 174*a* contacting the one upper wall of the spacer structure 152 and the void v included in the first barrier metal pattern 170*a* may be sufficiently long. Thus, in the wet cleaning process, the first barrier metal pattern 170*a* covered by the eighth barrier metal pattern 174*a* may not be etched. Even if the end portion of the eighth barrier metal pattern 174*a* is partially removed by the wet cleaning process, the void v included in the first barrier metal pattern 170*a* may not be exposed. Accordingly, the landing pad structure 184 may have a stable or more stable structure. In addition, defects in which an upper portion of the landing pad structure 184 are broken due to structural instability of the landing pad structure 184 may be decreased.

Figure 27:
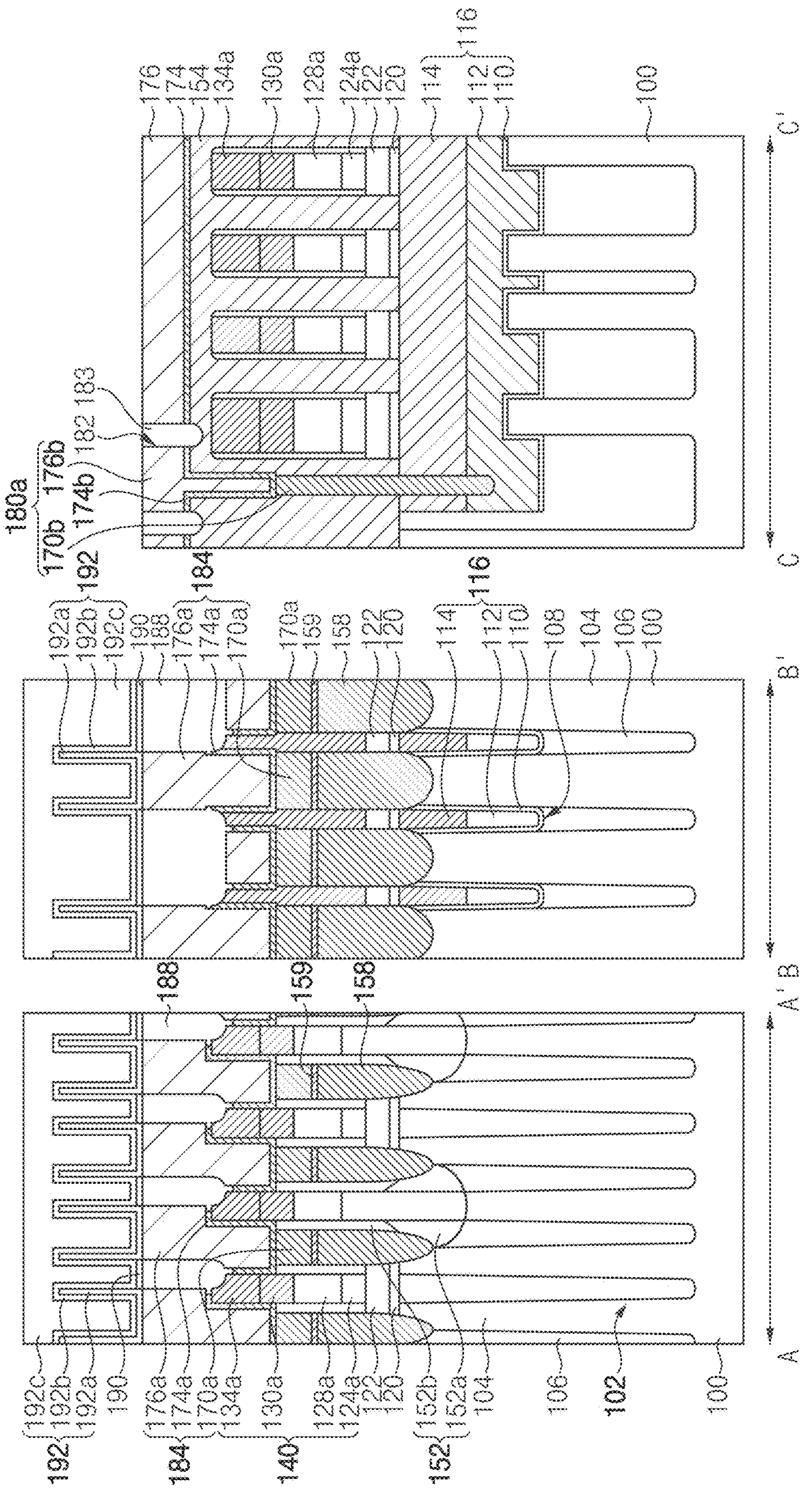

Referring to FIG. 27, a second upper insulation pattern 188 may be formed to fill the fifth opening 186 between the landing pad structures 184. The second upper insulation pattern 188 may include, e.g., silicon oxide.

An etch stop layer 190 may be formed on the second upper insulation pattern 188 and the landing pad structure 184. A memristor and/or a capacitor 192 may be formed on the landing pad structure 184 passing through the etch stop layer 190. The capacitor 192 may contact the landing pad structure 184. The capacitor 192 may include a lower electrode 192*a*, a dielectric layer 192*b* and an upper electrode 192*c*.

As described above, a memory device such as a DRAM device may be manufactured.

The semiconductor device may include the following structural features.

The structural features of the semiconductor device are described with reference to FIGS. 23, 26 and 27.

Referring to FIGS. 23, 26, and 27 again, the semiconductor device may be formed on a substrate 100 including a cell region I and a core/peripheral region II. A first gate structure 116, a bit line structure 140, a spacer structure 152, a fence insulation pattern 154, a lower contact plug 158, and a landing pad structure 184 and a capacitor 192 may be formed on the cell region I of the substrate 100. A second gate structure 142, a lower insulating interlayer 132 and first to third wirings 180*a*, 180*b* and 180*c* may be formed on the core/peripheral region II of the substrate 100.

The substrate 100 may include one or more of silicon, germanium, silicon-germanium, or a group III-V compound such as GaP, GaAs, or GaSb. In some example embodiments, the substrate 100 may include a Silicon On Insulator (SOI) substrate or a Germanium On Insulator (GOI) substrate. The substrate 100 may be doped or undoped.

The substrate 100 may include a trench for isolation, and an isolation pattern 106 may be formed in the trench.

The first gate structure 116 may be disposed inside the substrate 100 in the cell region I. For example, the first gate structure 116 may pass through upper portions of an active pattern 104 and the isolation pattern 106, and may extend in the first direction. A plurality of first gate structures 116 may be spaced apart from each other in the second direction. The first gate structure 116 may extend to an edge of a core/peripheral region II adjacent to the cell region I.

The first gate structure 116 may include a first gate insulation layer 110, a first gate electrode 112 and a lower capping pattern 114.

The first gate insulation layer 110 may include, e.g., an oxide such as silicon oxide. The first gate electrode 112 may include, e.g., one or more of tungsten (W), titanium (Ti), and/or tantalum (Ta), and/or a metal nitride such as tungsten nitride, titanium nitride, or tantalum nitride. The lower capping pattern 114 may include, e.g., a nitride such as silicon nitride.

A first buffer insulation layer 120 and a second buffer insulation layer 122 sequentially stacked on the active pattern 104, the isolation pattern 106 and the lower capping pattern 114 of the cell region I. A second gate insulation layer 121 may be formed on the active pattern 104 of the core/peripheral region II.

The bit line structure 140 in the cell region I may include a first conductive pattern 124*a*, a barrier metal pattern (not shown), a first metal pattern 128*a*, a first capping pattern 130*a*, and a second capping pattern 134*a* sequentially stacked. In some example embodiments, the bit line structure 140 may be formed on the active pattern 104 and the second buffer insulation layer 122, and may extend in the second direction.

A portion of the first conductive pattern 124*a* in the bit line structure 140 may be formed in the first opening 150 exposing an upper surface of the active pattern 104 and upper surfaces of the isolation pattern 106 and the lower capping pattern 114 adjacent the active pattern 104. Accordingly, the portion of the first conductive pattern 124*a* may contact the upper surface of the active pattern 104 exposed by the first opening 150. The first conductive pattern 124*a* may include, e.g., polysilicon doped with impurities.

The barrier metal pattern may include, e.g., a metal such as titanium (Ti) and/or tantalum (Ta) and/or a metal nitride such as titanium nitride and/or tantalum nitride. The first metal pattern 128*a* may include, e.g., a metal such as tungsten W. The first and second capping patterns 130*a* and 134*a* may include, e.g., a nitride such as silicon nitride.

The second gate structure 142 in the core/peripheral region II may include a second gate insulation layer 121, a first conductive pattern 124*a*, a first metal pattern 128*a*, and a first capping pattern 130*a* sequentially stacked.

As such, the second gate structure 142 in the core/peripheral region II and the bit line structure 140 in the cell region I may include the first conductive pattern 124*a*, the first metal pattern 128*a* and the first capping pattern 130*a* sequentially stacked. For example, the second gate structure 142 and the bit line structure 140 may have the same stacked structure.

A spacer 136 may be formed on a sidewall of the second gate structure 142. An end portion in the second direction of the bit line structure 140 may extend to an edge of the core/peripheral area II adjacent to the cell region I. The spacers 136 may be formed on a sidewall in the second direction of the bit line structure 140.

A lower insulating interlayer 132 may be formed on the substrate 100 between the second gate structures 142. The second capping pattern 134*a* may be formed on the second gate structure 142 and the lower insulating interlayer 132 in the core/peripheral region II.

The spacer structure 152 may be formed on sidewalls of the bit line structure 140. The spacer structure 152 may extend in the second direction. In example embodiments, the spacer structure 152 may include a plurality of spacers stacked from the sidewalls of the bit line structure 140. For example, the spacer structure 152 may include a first spacer 152*a* covering a lower sidewall of the bit line structure 140 positioned in the first opening and a second spacer 152*b* on a top portion of the first spacer to cover an upper sidewall of the bit line structure 140. In addition, third and fourth spacers (not shown) may be sequentially formed on the surface of the second spacer 152*b*.

In some example embodiments, the spacer structure 152 may include an air spacer serving as empty space. The fence insulation pattern 154 may be formed on the second buffer insulation layer 122. The fence insulation pattern 154 may be formed on the first gate structure 116 positioned between the bit line structures 140. The fence insulation pattern 154 may include, e.g., a nitride such as silicon nitride.

A third opening 156 exposing the active pattern 104 may be formed between the bit line structures 140 and between the fence insulation patterns 154. The lower contact plug 158 and the landing pad structure 184 may be formed in the third opening 156.

The lower contact plug 158 may contact the substrate 100 to fill a lower portion of the third opening 156. The lower contact plug 158 may include, e.g., polysilicon doped with impurities. A silicide pattern 159 may be further formed on the lower contact plug 158. Since the lower contact plug 158 including the polysilicon is formed, a parasitic capacitance between the lower contact plug 158 and the bit line structure 140 may be decreased.

The landing pad structure 184 may be formed on the lower contact plug 158. The landing pad structure 184 may include a first barrier metal pattern 170*a*, an eighth barrier metal pattern 174*a*, and a second metal pattern 176*a*.

The first barrier metal pattern 170*a* may be formed on the lower contact plug 158, and partially fill a remaining space of the third opening 156 on the lower contact plug 158. The first barrier metal pattern 170*a* may have a pillar shape. In some example embodiments, a void v may be included in an upper portion of the first barrier metal pattern 170*a*.

The eighth barrier metal pattern 174*a* may be formed along a surface profile of the third opening 156 on the first barrier metal pattern 170*a*. The eighth barrier metal pattern 174*a* may have end portions on the bit line structures adjacent the third opening 156. The eighth barrier metal pattern 174*a* may cover an entrance of the void (v). As the eighth barrier metal pattern 174*a* may be formed, a distance from the void v to an end portion (e.g., an uppermost portion) of the eighth barrier metal pattern 174*a* may be increased.

In a cross-sectional view, the eighth barrier metal pattern 174*a* may have a first portion contacting an upper surface of the first barrier metal pattern 170*a*, a second portion contacting one sidewall of the bit line structure 140 and a third portion contacting the upper surface and one sidewall of the bit line structure 140 facing the second portion.

The second metal pattern 176*a* may be formed on the eighth barrier metal pattern 174*a*. A void may not be included, or may be less likely to be included, in the second metal pattern 176*a*.

An edge portion of the eighth barrier metal pattern 174*a* may include a recessed portion that may be recessed from the second metal pattern 176*a* disposed thereon. Particularly, an end portion of the eighth barrier metal pattern 174*a* contacting an uppermost portion of the bit line structure 140 may be recessed from a lower sidewall of the upper second metal pattern 176*a*. An end portion of the eighth barrier metal pattern 174*a* contacting the one upper wall of the spacer structure 152 may include the recessed portion in a direction toward the substrate 100.

A stacked structure of the eighth barrier metal pattern 174*a* and the second metal pattern 176*a* may be separated on the bit line structure 140.

An uppermost surface of the first barrier metal pattern 170*a* may be lower than a lowermost surface of the second metal pattern 176*a*.

In example embodiments, each of the first barrier metal pattern 170*a* and the eighth barrier metal pattern 174*a* may include, e.g., titanium (Ti), tantalum (Ta), titanium nitride (TiN), or tantalum nitride (TaN). In example embodiments, the second metal pattern 176*a* may include, e.g., tungsten.

A fifth opening 186 may be formed between stacked structures of the eighth barrier metal pattern 174*a* and the second metal pattern 176*a*. A second upper insulation pattern 188 may be formed in the fifth opening 186. The second upper insulation pattern 188 may contact the eighth barrier metal pattern 174*a* and the second metal pattern 176*a*. The second upper insulation pattern 188 may include, e.g., silicon oxide.

An upper portion of the bit line structure 140 positioned on a lower surface of the fifth opening 186 may have a recessed shape. That is, the upper portion of the bit line structure 140 disposed between adjacent second metal patterns 176*a* may include a recessed portion.

In various example embodiments, upper surfaces of the landing pad structure 184 and the second upper insulation pattern 188 may be coplanar with each other. In the cell region I, an upper surface of the first barrier metal pattern 170*a* may be lower than a lower surface of the second upper insulation pattern 188. An upper surface of the first barrier metal pattern 170*a* may be lower than a lower surface of the recessed portion of the bit line structure 140.

In the landing pad structure 184, a lower width of a structure in which the eighth barrier metal pattern 174*a* and the second metal pattern 176*a* are stacked may be greater than an upper width of the first barrier metal pattern 170*a*.

An etch stop layer 190 may cover the landing pad structure 184 and the second upper insulation pattern 188*b*.

A capacitor 192 may contact an upper surface of the landing pad structure 184 passing through the etch stop layer 190.

A first contact hole 160 may expose the first conductive pattern 124*a* of an edge of the bit line structure 140 in the core/peripheral region II adjacent to the cell region I. A first wiring including a second barrier metal pattern 170*b*, a fifth barrier metal pattern 174*b* and a third metal pattern 176*b* may be formed in the first contact hole 160 and on the second capping pattern 134*a*. The second barrier metal pattern 170*b* may fill a lower portion of the first contact hole 160. The fifth barrier metal pattern 174*b* may cover an upper surface of the second barrier metal pattern 170*b*, and may be conformally formed on a sidewall of the first contact hole 160 and an upper surface of the second capping pattern 134*a*.

A second contact hole 162 may expose impurity regions 144 adjacent to both sides of the second gate structure 142 in the core/peripheral region II. A second wiring including a third barrier metal pattern 170*c*, a sixth barrier metal pattern 174*c* and a fourth metal pattern 176*c* may be formed in the second contact hole 162 and on the second capping pattern 134*a*. The third barrier metal pattern 170*c* may fill a lower portion of the second contact hole 162. The sixth barrier metal pattern 174*c* may cover an upper surface of the third barrier metal pattern 170*c*, and may be formed, e.g., conformally formed on a sidewall of the second contact hole 162 and the upper surface of the second capping pattern 134*a*.

A third contact hole 164 may expose the first gate electrode 112 at an edge of the first gate structure 116 in the core/peripheral region II adjacent to the cell region I. A third wiring 180*c* including a seventh barrier metal pattern 174*d*, a seventh barrier metal pattern 174*d*, and a fifth metal pattern 176*d* may be formed in the third contact hole 164 and on the second capping pattern 134*a*. The seventh barrier metal pattern 174*d* may fill a lower portion of the third contact hole 160. The seventh barrier metal pattern 174*d* may cover an upper surface of the fourth barrier metal pattern 170*d*, and may be formed, e.g., conformally formed on a sidewall of the third contact hole 164 and the upper surface of the second capping pattern 134*a*.

The second to fourth barrier metal patterns 170*b*, 170*c*, and 170*d* may include at least one material that is the same as at least one material of the first barrier metal pattern 170*a*. Each of the second to fourth barrier metal patterns 170*b*, 170*c*, and 170*d* may have a pillar shape. The fifth to seventh barrier metal patterns 174*b*, 174*c*, and 174*d* may include a material as a material of the eighth barrier metal pattern

174*a*. The second to fifth metal patterns 176*a*, 176*b*, 176*c*, and 176*d* may include the same material to each other.

As such, each of the first to third wirings 180*a*, 180*b*, and 180*c* may have a stacked structure the same as a stacked structure of the landing pad structure 184.

In some example embodiments, at least one of the first to third wirings 180*a*, 180*b*, and 180*c* may have a stacked structure different from that of the landing pad structure 184. In this case, the wiring having a stacked structure different from that of the pad pattern structure 184 may be formed by performing etching, deposition, and patterning processes different from the processes of forming the pad pattern structure 184.

Figure 28:
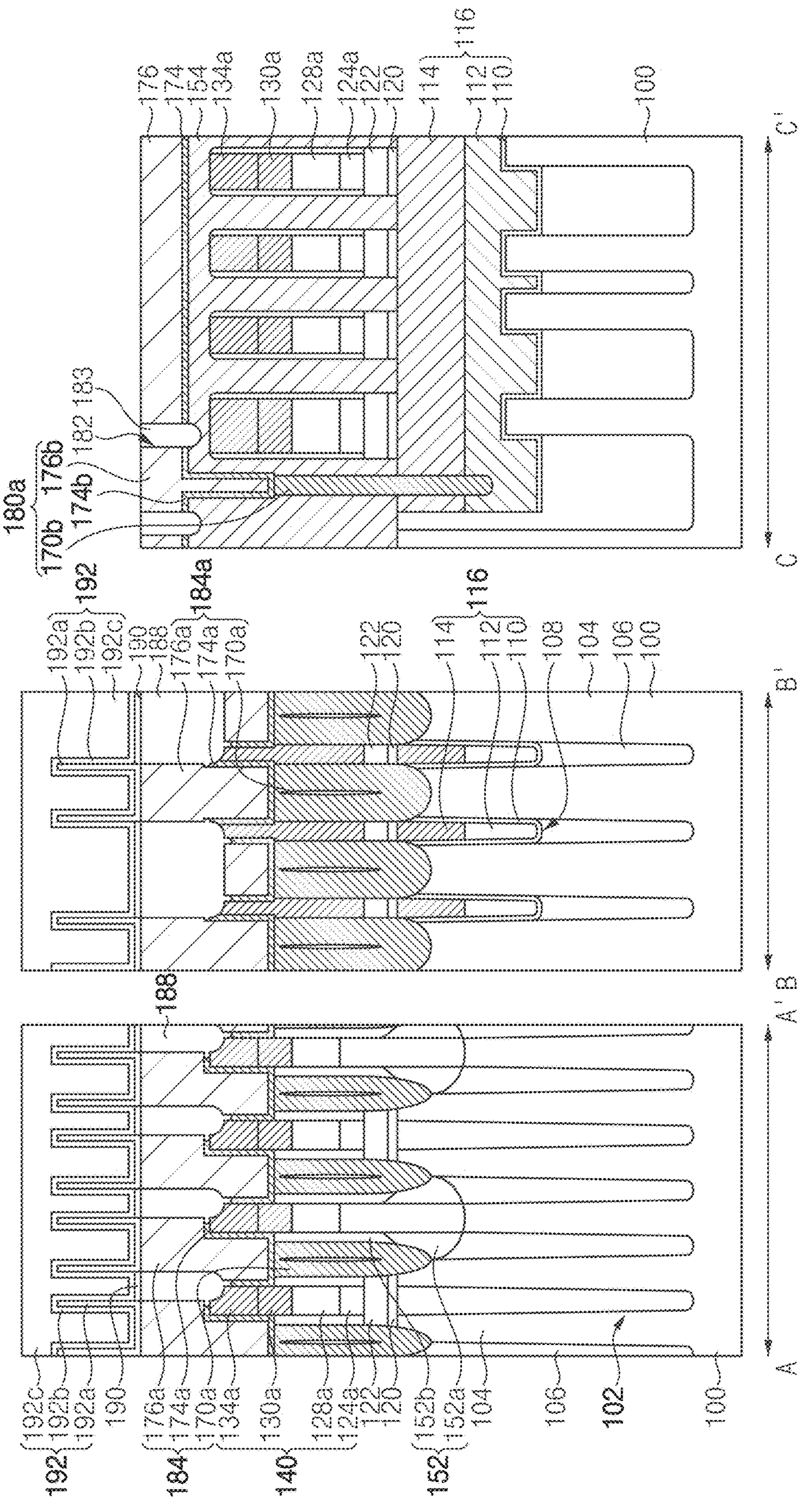
Figure 29:
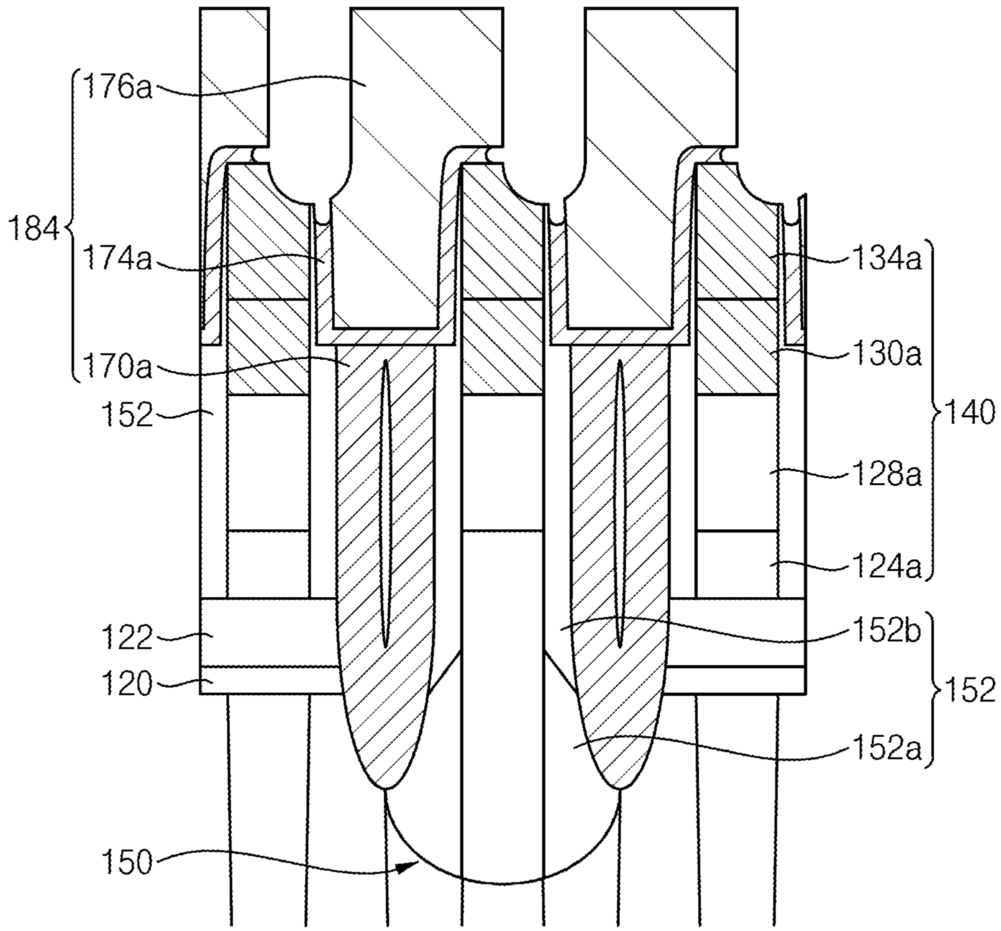

FIGS. 28 and 29 are a cross-sectional view and an enlarged cross-sectional view illustrating semiconductor devices in accordance with various example embodiments.

The semiconductor device shown in FIGS. 28 and 29 may be substantially the same as the semiconductor device described with reference to FIGS. 23, 26 and 27, except that the lower contact plug is not formed. Therefore, redundant descriptions are omitted.

Referring to FIGS. 28 and 29, a pad pattern structure 184*a* may be formed on a lower portion of the third opening 156 between the bit line structure 140 and the fence insulation pattern 154.

The pad pattern structure 184*a* may include a first barrier metal pattern 170*a*, an eighth barrier metal pattern 174*a*, and a second metal pattern 176*a*.

The first barrier metal pattern 170*a* may fill the lower portion of the third opening 156. The first barrier metal pattern 170*a* may contact the substrate 100 exposed by the third opening 156. The first barrier metal pattern 170*a* may have a pillar shape. In example embodiments, a void may be included in the first barrier metal pattern 170*a*.

The eighth barrier metal pattern 174*a* may be formed along a surface profile of the third opening 156 on the first barrier metal pattern 170*a*. The eighth barrier metal pattern 174*a* may cover an entrance of the void.

A spacer structure on an upper sidewall of the third opening 156 over the first barrier metal pattern 170*a* may be partially etched. Accordingly, a width of the third opening 156 over the first barrier metal pattern 170*a* may be greater than that of the third opening 156 thereunder.

The second metal pattern 176*a* may be formed on the eighth barrier metal pattern 174*a*. A void may not be included, or may be less likely to be included in the second metal pattern 176*a*. An edge portion of the eighth barrier metal pattern 174*a* may include a recessed portion that may be recessed from the second metal pattern 176*a* disposed thereon.

The semiconductor device may be manufactured by processes substantially the same as processes as that described with reference to FIGS. 1 to 27. However, the process of forming the lower contact plug described with reference to FIG. 10 may not be performed.

As described above, the semiconductor device may include a structurally stable landing pad structure. Accordingly, the semiconductor device may have desired or improved electrical characteristics.

The foregoing is illustrative of various example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims. Furthermore example embodiments are not necessarily mutually exclusive with one another. For example, some example embodiments may include one or more features described with reference to one or more figures, and may also include one or more other features described with reference to one or more other figures.

What is claimed is:

1. A semiconductor device, comprising:

bit line structures on a substrate and extending lengthwise in a first direction;

a silicide pattern between the bit line structures; and a landing pad structure on the silicide pattern and between the bit line structures;

wherein the landing pad structure includes:

a first barrier metal pattern, the first barrier metal pattern on the silicide pattern and having a material different than a material of the silicide pattern, a second barrier metal pattern on the first barrier metal pattern, the second barrier metal pattern covering and overlying a portion of an upper surface of each of the bit line structures, and a first metal pattern on the second barrier metal pattern, and the first metal pattern having an upper surface higher than the upper surface of each of the bit line structures.

2. The semiconductor device of claim 1, wherein each of the first barrier metal pattern and the second barrier metal pattern independently include at least one selected from titanium (Ti), tantalum (Ta), titanium nitride (TiN), and tantalum nitride (TaN).

3. The semiconductor device of claim 1, wherein the first metal pattern includes tungsten.

4. The semiconductor device of claim 1, wherein in a cross-sectional view, the second barrier metal pattern includes a first portion on an upper surface of the first barrier metal pattern, a second portion on one sidewall of a capping pattern included in one of the bit line structures, and a third portion on an upper surface of the capping pattern.

5. The semiconductor device of claim 1, wherein ends of the second barrier metal pattern includes a recessed portion from the first metal pattern on the second barrier metal pattern.

6. The semiconductor device of claim 1, wherein in the landing pad structure, a lower width of a substructure in which the second barrier metal pattern and the first metal pattern are stacked is greater than an upper width of the first barrier metal pattern.

7. The semiconductor device of claim 6, wherein the upper surface of the bit line structure has a recessed portion, and an upper surface of the first barrier metal pattern is lower than a bottom of the recessed portion on the bit line structure.

8. The semiconductor device of claim 1, wherein the first barrier metal pattern has a pillar shape.

9. The semiconductor device of claim 1, wherein
an upper portion of the first barrier metal pattern defines a void, and
the second barrier metal pattern covers the void of the first barrier metal pattern.

10. The semiconductor device of claim 1, wherein each of the bit line structures includes a first metal layer and a capping pattern on the first metal layer, and
the second barrier metal pattern on a first sidewalls and a second sidewalls of the capping pattern.

11. The semiconductor device of claim 1, wherein the silicide pattern includes at least one of CoSi, or NiSi.

12. A semiconductor device, comprising:
a first gate structure below an upper surface of a substrate, and extending lengthwise in a first direction;
bit line structures on the substrate, and extending lengthwise in a second direction perpendicular to the first direction;
a lower contact plug between the bit line structures;
a silicide pattern on the lower contact plug and between the bit line structures;
a landing pad structure on the silicide pattern and between the bit line structures; and
a capacitor on the landing pad structure,
wherein the landing pad structure includes;
a first barrier metal pattern on the silicide pattern and having a material different than a material of the silicide pattern, an upper portion of the first barrier metal pattern defining a void;
a second barrier metal pattern on the first barrier metal pattern and covering the void, the second barrier metal pattern covering and overlying a portion of an upper surface of each of the bit line structures; and
a first metal pattern on the second barrier metal pattern, the first metal pattern having an upper surface higher than the upper surface of each of the bit line structures.

13. The semiconductor device of claim 12, wherein the lower contact plug includes doped polysilicon.

14. The semiconductor device of claim 13, wherein each of the first barrier metal pattern and the second barrier metal pattern independently include at least one selected from titanium (Ti), tantalum (Ta), titanium nitride (TiN), and tantalum nitride (TaN).

15. The semiconductor device of claim 13, wherein the first metal pattern includes tungsten.

16. The semiconductor device of claim 13, wherein in a cross-sectional view, the second barrier metal pattern includes a first portion on the upper surface of the first barrier metal pattern, a second portion on a sidewall of each of the bit line structures, and a third portion on the portion of the upper surface of the each of the bit line structures.

17. The semiconductor device of claim 13, wherein in the landing pad structure, a lower width of a substructure in which the second barrier metal pattern and the first metal pattern are stacked is greater than an upper width of the first barrier metal pattern.

18. A semiconductor device, comprising:
a substrate including a cell region and a core/peripheral region;
a first gate structure under an upper surface of the cell region of the substrate;
bit line structures on the cell region of the substrate;
a second gate structure on the core/peripheral region of the substrate;
a landing pad structure between the bit line structures, and an upper surface of the landing pad structure being higher than an upper surface of each of the bit line structures;
a capacitor on the landing pad structure;
a first wiring electrically connected to the first gate structure; and
a second wiring electrically connected to a bit line structure among the bit line structures;
wherein each of the landing pad structure, the first wiring, and the second wiring includes:
a first barrier metal pattern having a pillar shape,
a second barrier metal pattern on the first barrier metal pattern, and
a first metal pattern on the second barrier metal pattern, the first metal pattern having an upper surface higher than the upper surface of each of the bit line structures.

19. The semiconductor device of claim 18, wherein the first barrier metal pattern includes at least one selected from titanium (Ti), tantalum (Ta), titanium nitride (TiN), and tantalum nitride (TaN), and the second barrier metal pattern includes least one selected from titanium (Ti), tantalum (Ta), titanium nitride (TiN), and tantalum nitride (TaN).

* * * * *